United States Patent
Abdo

(10) Patent No.: US 9,843,312 B2
(45) Date of Patent: Dec. 12, 2017

(54) MULTIMODE JOSEPHSON PARAMETRIC CONVERTER: COUPLING JOSEPHSON RING MODULATOR TO METAMATERIAL

(71) Applicant: International Business Machines Corporation, Armonk, NY (US)

(72) Inventor: Baleegh Abdo, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 45 days.

(21) Appl. No.: 14/871,562

(22) Filed: Sep. 30, 2015

(65) Prior Publication Data

US 2017/0093381 A1    Mar. 30, 2017

(51) Int. Cl.
*H03K 3/38*    (2006.01)
*H01L 39/22*    (2006.01)
*H01L 39/02*    (2006.01)

(52) U.S. Cl.
CPC ............. *H03K 3/38* (2013.01); *H01L 39/025* (2013.01); *H01L 39/223* (2013.01)

(58) Field of Classification Search
CPC ...... B82Y 10/00; G06N 99/00; G06N 99/002; H01L 39/00; H01L 39/025; H01L 39/223; H03K 17/00; H03K 17/92; H03K 3/00; H03K 3/38; H03K 19/1954; H03F 3/193; H03F 3/607; H03F 1/42; H03F 19/00; H03H 11/04
USPC .......................................... 327/528; 326/1–3
See application file for complete search history.

(56) References Cited

U.S. PATENT DOCUMENTS

| | | | |
|---|---|---|---|
| 5,105,166 A | 4/1992 | Tsukii et al. | |
| 7,570,075 B2 | 8/2009 | Gupta et al. | |
| 7,724,083 B2 | 5/2010 | Herring et al. | |
| 8,154,340 B2 | 4/2012 | Dupuy et al. | |
| 8,861,619 B2 | 10/2014 | McDermontt et al. | |
| 8,878,626 B2 | 11/2014 | Zmuidzinas et al. | |
| 9,350,460 B2 * | 5/2016 | Paik | H04B 10/70 |
| 9,548,742 B1 * | 1/2017 | Abdo | H03K 3/38 |

(Continued)

FOREIGN PATENT DOCUMENTS

| | | |
|---|---|---|
| CN | 101436713 A | 5/2009 |
| EP | 0430509 A2 | 6/1991 |
| JP | 03188705 A | 8/1991 |

OTHER PUBLICATIONS

International Search Report and Written Opinion, International Application No. PCT/IB2016/055741; International Filing date Sep. 26, 2016; dated Jan. 12, 2017; pp. 1-11.

(Continued)

*Primary Examiner* — Dinh T Le
(74) *Attorney, Agent, or Firm* — Cantor Colburn LLP; Vazken Alexanian

(57) ABSTRACT

A technique relates to operating a multimode Josephson parametric converter as a multimode quantum limited amplifier. The multimode Josephson parametric converter receives multiple quantum signals in parallel at different resonance frequencies. The multimode Josephson parametric converter amplifies simultaneously the multiple quantum signals, according to pump signals applied to the multimode Josephson parametric converter. The multiple quantum signals having been amplified at the different resonance frequencies are reflected, according to the pump signals.

12 Claims, 12 Drawing Sheets

(56) References Cited

U.S. PATENT DOCUMENTS

| | | | | |
|---|---|---|---|---|
| 2015/0241481 A1* | 8/2015 | Narla | ............ | H03D 9/00 324/602 |
| 2016/0308502 A1* | 10/2016 | Abdo | ............ | H03F 7/04 |

OTHER PUBLICATIONS

A. Narla, et al., "Wireless Josephson amplifier," Applied Physics Letters, vol. 104, No. 232605, Jun. 12, 2014, pp. 1-5.

A. Poudel, et al.,"Quantum efficiency of a microwave photon detector based on a current-biased Josephson junction", Physical Review, vol. 86, Nov. 6, 2012, p. 1-4.

B. Abdo, "Incorporating Arrays of Josephson Junctions in a Josephson Junction Ring Modulator in a Joesephson Parametric Converter," U.S. Appl. No. 14/754,315, filed Jun. 29, 2015, pp. 1-25.

B. Abdo, "Joesephson-Coupled Resonator Amplifier (JRA)," U.S. Appl. No. 14,743,315, filed Jun. 29, 2015, pp. 1-31.

B. Abdo, et al.,"Josephson amplifier for qubit readout", Applied Physics Letters, vol. 99, No. 16, Oct. 18, 2011, p. 1-3.

B.Abdo, et al.,"Nondegenerate three-wave mixing with the Josephson ring modulator," Physical Review B, vol. 87, No. 014508, Jan. 16, 2013, pp. 1-18.

Baleegh Abdo, "Multimode Josephson Parametric Converter: Coupling Josephson Ring Modulator to Metamaterial" U.S. Appl. No. 14/871,477, filed Sep. 30, 2015.

Baleegh Abdo, "Multimode Josephson Parametric Converter: Coupling Josephson Ring Modulator to Metamaterial" U.S. Appl. No. 14/952,117, filed Nov. 25, 2015.

C. K. Andersen, et al.,"Quantized resonator field coupled to a current-biased Josephson junction in circuit QED", Physical Review, vol. 89, Mar. 27, 2014, p. 1-9.

E. Flurin, et al., "Generating Entangled Microwave Radiation Over Two Transmission Lines", Physical Review Letters, Prl. 109, Oct. 31, 2012, p. 1-5.

G. Kirchmair, et al.,"Observation of quantum state collapse and revival due to the single-photon Kerr effect", Nature, vol. 495, Mar. 14, 2013, p. 1-5.

J. Bourassa, et al.,"Josephson junction-embedded transmission-line resonators: from Kerr medium to in-line transmon", arXiv, vol. 2, Jul. 17, 2012, p. 1-15.

L. C. G. Govia, et al.,"High-fidelity qubit measurement with a microwave-photon counter", Physical Review, vol. 90, Dec. 2, 2014, p. 1-12.

List of IBM Patents or Patent Applications Treated as Related; Date Filed Sep. 30, 2015, p. 1-2.

M. Hartrige, et al.,"Quantum Back-Action of an Individual Variable-Strength Measurement", Reports, Science Magazine, vol. 339, Jan. 11, 2013, p. 1-5.

N. Bergeal, et al.,"Analog information processing at the quantum limit with a Josephson ring modulator", Nature Physics, Articles, Feb. 14, 2010, p. 1-7.

N. Bergeal, et al.,"Phase-preserving amplification near the quantum limit with a Josephson ring modulator," Nature, vol. 465, May 6, 2010, pp. 1-6.

N. Bergeal, et al.,"Two-Mode Correlation of Microwave Quantum Noise Generated by Parametric Down-Conversion", Physical Review Letters, Mar. 21, 2012, p. 1-5.

N. Roch, et al.,"Widely Tunable, Nondegenerate Three-Wave Mixing Microwave Device Operating near the Quantum Limit," Physical Review Letters, vol. 108, No. 147701, Apr. 6, 2012, pp. 1-5.

O. Suchoi, et al.,"Intermode dephasing in a superconducting stripline resonator", Physical Review, vol. 81, May 24, 2010, p. 1-8.

* cited by examiner

MULTIMODE JOSEPHSON PARAMETRIC CONVERTER: COUPLING JOSEPHSON RING MODULATOR TO METAMATERIAL

BACKGROUND

The present invention relates to quantum information processing in the microwave domain using superconducting circuits, and more specifically, to a multimode Josephson parametric converter.

Recent progress in solid-state quantum information processing has stimulated the search for amplifiers and frequency converters with quantum-limited performance in the microwave domain. Depending on the gain applied to the quadratures of a single spatial and temporal mode of the electromagnetic field, linear amplifiers can be classified into two categories (phase sensitive and phase preserving) with fundamentally different noise properties. Phase-sensitive amplifiers squeeze the input noise and signal in one quadrature of the microwave field at the expense of inflating the noise and signal in the other quadrature without adding noise of their own to the processed signal, but are useful only in cases in which the quantum information is encoded in one quadrature of the microwave field. A phase-preserving amplifier on the other hand amplifies both quadratures of the input noise and signal at the expense of adding at least a noise equivalent to a half input photon at the signal frequency. Such an amplifier would be useful in many quantum applications, including qubit readout. One successful realization of a non-degenerate—intrinsically phase-preserving—superconducting parametric amplifier is based on a Josephson ring modulator, which consists of four Josephson junctions in a Wheatstone bridge configuration. The device symmetry enhances the purity of the amplification process, i.e., eliminates or minimizes certain undesired nonlinear processes, and also simplifies both its operation and its analysis.

SUMMARY

According to one embodiment, a method of operating a multimode Josephson parametric converter as a multimode quantum limited amplifier is provided. The method includes receiving, by the multimode Josephson parametric converter, multiple quantum signals in parallel at different resonance frequencies, and amplifying simultaneously, by the multimode Josephson parametric converter, the multiple quantum signals, according to pump signals applied to the multimode Josephson parametric converter. Also, the method includes reflecting the multiple quantum signals having been amplified at the different resonance frequencies, according to the pump signals.

According to one embodiment, a method of operating a multimode Josephson parametric converter to generate multiple pairs of entangled photons. The method includes receiving, by a first multimode resonator in the multimode Josephson parametric converter, a first group of signals at different resonance frequencies of the resonance modes of the first multimode resonator, where the first multimode resonator is a first left-handed transmission line. The method includes receiving, by a second multimode resonator in the multimode Josephson parametric converter, a second group of signals at different resonance frequencies of the resonance modes of the second multimode resonator, where the second multimode resonator is a second left-handed transmission line. Also, the method includes receiving pump signals, by the second multimode resonator, where the pump signals are a first frequency sum through a last frequency sum, and generating pairs of entangled photons, the pairs of entangled photons including a first pair through a last pair.

According to one embodiment, a method of remote entanglement of multiple qubits by measurement is provided. The method includes receiving, by a first multimode resonator in the multimode Josephson parametric converter, a first group of readout signals resonant with resonance modes of the first multimode resonator, where the first multimode resonator is a first left-handed transmission line. The method includes receiving, by a second multimode resonator in the multimode Josephson parametric converter, a second group of readout signals resonant with resonance modes of the second multimode resonator, where the second multimode resonator is a second left-handed transmission line. Also, the method includes receiving pump signals, by the second multimode resonator, wherein the pump signals are a first frequency sum through a last frequency sum, and generating, by the Josephson parametric converter, a first qubit pair based on the first frequency sum through a last qubit pair based on the last frequency sum.

According to one embodiment, a method of generating a bell state using photons as quantum bits. The method includes providing a first multimode resonator and a second multimode resonator both connected to a dispersive nonlinear medium, where the first multimode resonator is a first left-handed transmission line and the second multimode resonator is a second left-handed transmission line, and where resonance modes are identical in the first and second multimode resonators. The method includes receiving, by the second multimode resonator, a pump signal at a frequency sum, where the frequency sum is a summation of a resonance frequency of the resonance modes plus another resonance frequency of the resonance modes. Also, the method includes generating a first photon and a second photon in an equal superposition of spatial states, where the equal superposition of the spatial states for the first and second photons are related to being in the first multimode resonator and the second multimode resonator.

DETAILED DESCRIPTION

Embodiments disclose a quantum device based on the Josephson ring modulator suitable for quantum information processing. The quantum device includes a Josephson ring modulator coupled to multimode resonators implemented using metamaterial/left-handed transmission lines, thereby forming a multimode Josephson parametric converter.

Figure 1:
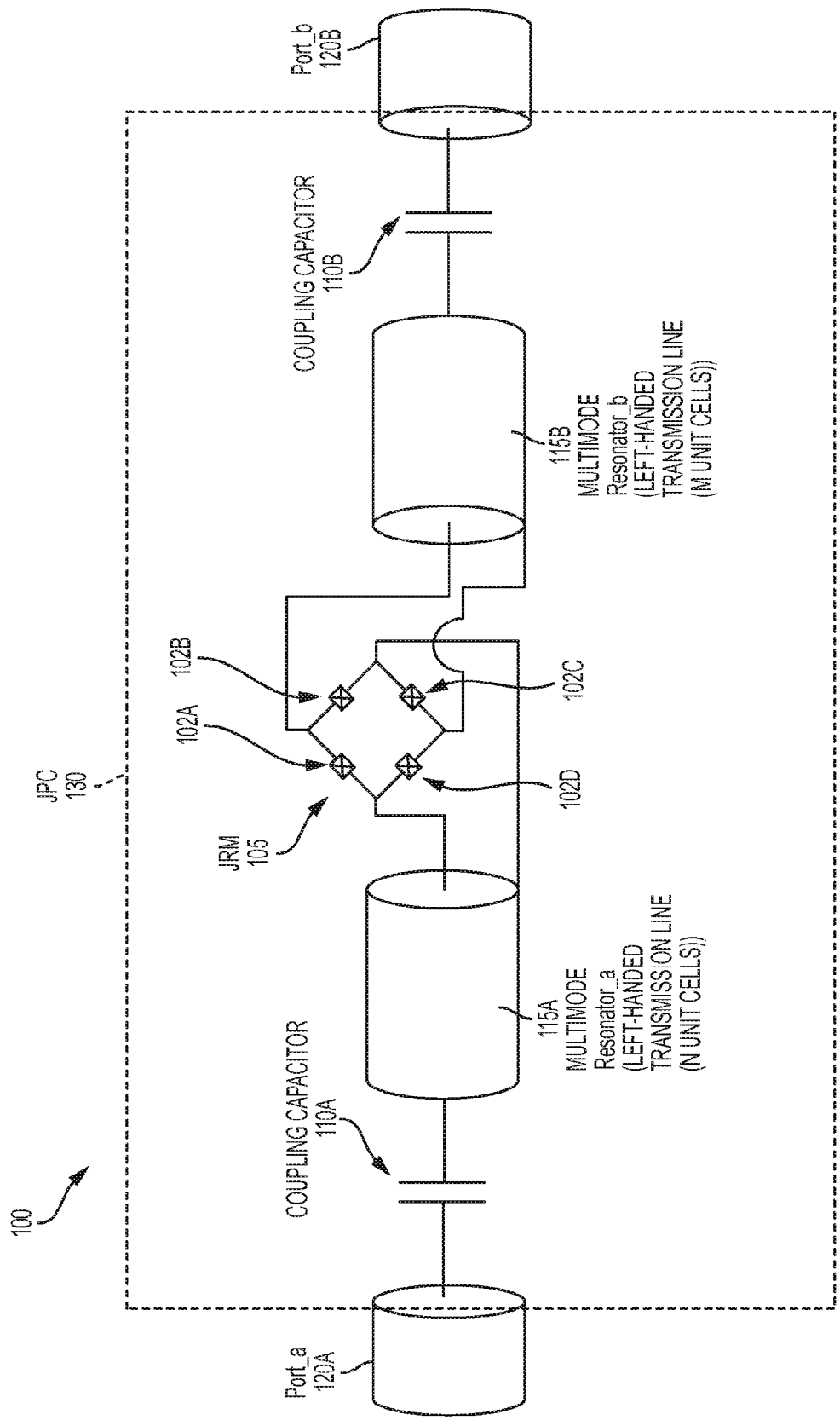
FIG. 1 is a high-level schematic of a quantum microwave device according to an embodiment.

FIG. 1 is a high-level schematic of a quantum microwave device 100 according to an embodiment. The quantum device 100 includes a multimode Josephson ring modulator (JRM) 105 which is a nonlinear dispersive element based on Josephson tunnel junctions 102A, 102B, 102C, and 102D that can perform three-wave mixing of microwave signals at the quantum limit. The JRM 105 consists of four nominally identical Josephson junctions 102A-102D arranged in a Wheatstone bridge configuration. In order to construct a non-degenerate parametric device that is the multimode Josephson parametric converter (JPC) 130, which is capable of amplifying and/or mixing microwave signals at the quantum limit, the JRM 105 is incorporated into two multimode microwave resonators at a radio frequency (RF) current anti-node of the multiple of their eigenmodes.

One of the multimode microwave resonators is multimode resonator_a 115A and the other is multimode resonator_b 115B. The multimode resonator_a 115A is a left-handed transmission line with N unit cells, and the multimode resonator_b 115B is a left-handed transmission line with M unit cells as discussed further below. A coupling capacitor 110A connects the multimode resonator_a 115A to port_a 120A while the coupling capacitor 110B connects the multimode resonator_b 115B to port_b 120B. The multimode JPC 130 includes both the multimode resonator_a 115A and multimode resonator_b 115B, along with the JRM 105.

The performances (namely power gain G, dynamical bandwidth γ, and maximum input power $P_{max}$) of the multimode JPC 130 are strongly dependent on the critical current $I_0$ of the Josephson junctions 102A-102D of the JRM 105, the specific realization of the electromagnetic environment (i.e., the microwave multimode resonator_a 115A and microwave multimode resonator_b 115B), the coupling between the JRM 105 and the multimode resonators 115A and 115B, and the coupling between the multimode resonators to the feedlines.

The port_a 120A and/or port_b 120B may be microwave coaxial lines or waveguides. Although not shown, other devices connected to the quantum device 100 may include hybrids, attenuators, circulators, isolators, lowpass microwave filters, bandpass microwave filters, infrared filters, and qubit-cavity systems.

Figure 2:
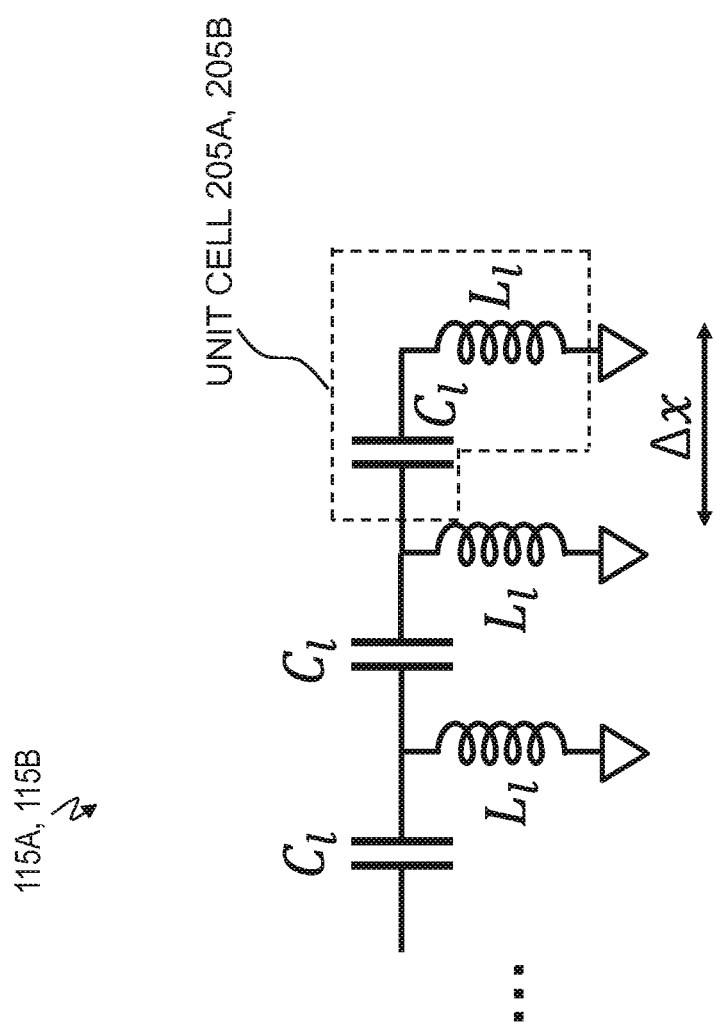
FIG. 2 is a circuit representation of a semi-infinite lossless left-handed transmission line utilized in the multimode microwave resonators of a multimode Josephson parametric converter according to an embodiment.

FIG. 2 is a circuit of a semi-infinite lossless left-handed transmission line which may be utilized in the construction of the multimode microwave resonator_a 115A and the multimode microwave resonator_b 115B according to an embodiment. The unit cell, e.g., unit cell 205A for microwave multimode resonator_a 115A and unit cell 205B for microwave multimode resonator_b 115B, includes a capacitor $C_l$ connected to inductor $L_l$ where "l" represent left-handed transmission line. The other end of the inductor $L_l$ is connected to ground. The unit cell 205A, 205B is connected to another unit cell, which is connected to another unit cell, and so forth. The unit cell 205A is repeated N amount of times for the multimode resonator_a 115A, and the unit cell 205B is repeated M amount of times for the multimode resonator_b 115B, as shown further below.

The dispersion relation of a left-handed transmission line reads $$\omega_l(k_l) = \frac{1}{2\sqrt{L_l C_l} \sin\left(\frac{k_l \Delta x}{2}\right)}$$

where $\Delta x$ is the size of the unit cell, and $k_l$ is the wave vector.

The phase and group velocity of the left-handed transmission line have opposite orientation $$\frac{\partial \omega_l(k)}{\partial k} < 0,$$

where k is $k_l$. One consequence of this relation is that in left-handed transmission lines low-frequencies correspond to short wavelengths. In contrast, in right-handed transmission lines where the dispersion relation increases with the wave vector, low-frequencies correspond to long wavelengths.

The characteristic impedance of the left-handed transmission line is $$Z_l = \sqrt{\frac{L_l}{C_l}}.$$

Low-frequency bound of the left-handed transmission line is $$\omega_{IR} = \frac{1}{2\sqrt{L_l C_l}}.$$

Figure 3:
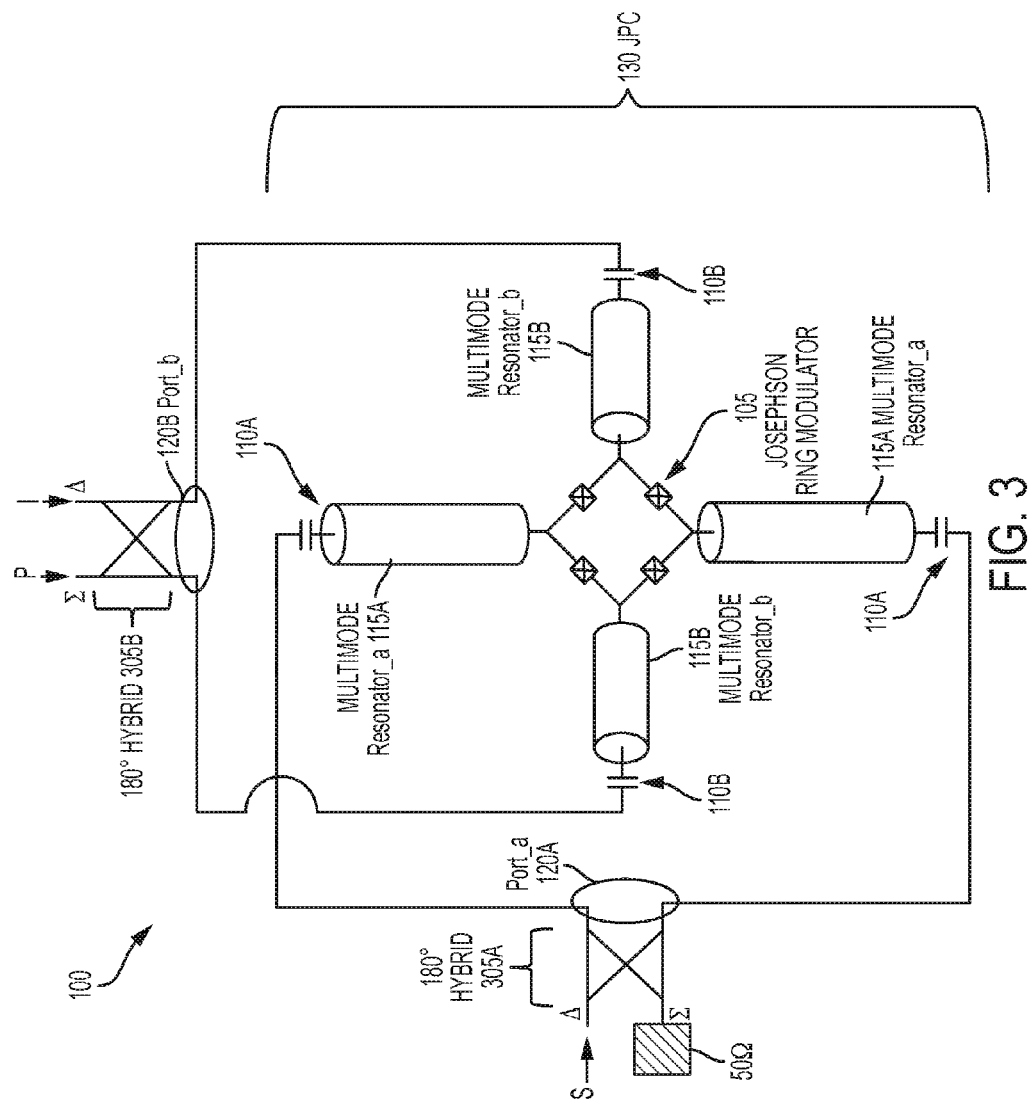
FIG. 3 is a schematic of the multimode Josephson parametric converter according to an embodiment.

FIG. 3 is a schematic of the multimode Josephson parametric converter 130 according to an embodiment. In FIG. 3, a 180° hybrid coupler 305A may be connected to port_a 120A and a 180° hybrid coupler 305B may be connected to port_b 120B.

A 180° hybrid is a 4-port microwave device which is reciprocal, matched, and ideally lossless. The 180° hybrid splits an input signal into two equal amplitude outputs. When fed from its sum port (Σ) the 180° hybrid provides two equal-amplitude in-phase output signals, whereas when fed from its difference port (Δ), it provides two equal-amplitude 180° out-of-phase output signals.

One scenario assumes that there is a Signal (S) tone that lies within the bandwidth of one of the resonance modes of the multimode microwave resonator_a which strongly couples to the JRM and is input through the Δ port of the 180° hybrid 305A, and the 50 ohm (Ω) termination is connected to the Σ port of the 180° hybrid 305A. It also assumes that there is an Idler (I) tone that lies within the bandwidth of one of the resonance modes of the multimode microwave resonator_b which strongly couples to the JRM and is input through the Δ port of the 180° hybrid 305B and a pump (P) tone input into the Σ port of the 180° hybrid 305B. Note that multiple pump tones at different frequencies may be utilized in order to feed the device.

The two main operation modes of the device are amplification mode (with photon gain) in which the applied pump frequency $f_P$ satisfies the relation $$f_P = f_I + f_S,$$

where $f_S$ and $f_I$ are the frequency of the Signal (S) and the Idler (I) tones respectively, and unitary frequency conversion mode (without photon gain) in which the applied pump frequency $f_P$ satisfies the relation $$f_P = |f_I - f_S|.$$

Different implementations of the quantum device with the multimode Josephson parametric converter 130 are discussed herein according to embodiments.

In contrast, to dual-differential-mode (standard nondegenerate) state-of-the-art Josephson parametric converters made of right-handed transmission lines, e.g., microstrip resonators, where the JRM is strongly couples to the two fundamental resonance modes of the two physical resonators of the device within the frequency band of interest, e.g. 5-15 GHz, the two multimode resonators of the multimode JPC 130, realized using metamaterial/left-handed transmission lines in embodiments (i.e., multimode resonator_a 115A and multimode resonator_b 115B), can be designed and engineered such that the JRM 105 strongly couples to multiple differential modes within the frequency band of interest. That is, each multimode resonator_a 115A and multimode resonator_b 115B has multiple resonance modes within the frequency band of interest, e.g. 5-15 GHz, many of which strongly couple to the JRM 105, as opposed to the state-of-the-art JPCs having (only) two fundamental differential resonance modes for its resonators within the band of interest which strongly couple to the JRM.

Multimode means that the multimode resonator_a 115A has multiple resonance modes and that the multimode resonator_b 115B has multiple resonance modes within a certain frequency band of interest, e.g. 5-15 GHz. This means that multimode resonator_a 115A is configured to resonate at multiple resonance frequencies from a first resonance frequency through a last resonance frequency within a certain frequency band of interest, which may include hundreds of resonance frequencies. Similarly, the multimode resonator_b 115B is configured to resonate at multiple resonance frequencies from a first resonance frequency through a last resonance frequency within a certain frequency band of interest, e.g. 5-15 GHz, which may include hundreds of resonance frequencies.

One notable property of the left-handed transmission lines/resonators (respectively implemented as multimode resonator_a 115A and multimode resonator_b 115B) is that they have a large density of modes (i.e., density of resonance modes) close to their low-frequency bound $\omega_{IR}$ making them multimode resonators in the frequency band of interest. For quantum measurements in superconducting devices, the band of interest is the microwave band of approximately 5-15 gigahertz (GHz) (commonly used for qubit readout and measurement). The multimode resonator_a 115A and multimode resonator_b 115B each can have a high density of resonance modes (i.e., harmonics or resonance frequencies) between approximately 5-15 GHz, which is beneficial for quantum measurements. In contrast, a right-handed transmission line (as a resonator) may have only one harmonic (one frequency resonance mode) at about 10 GHz and the next harmonic may be about 20 GHz (which is outside the 5-15 GHz microwave band of interest) in the state-of-the-art. Frequency resonance modes outside the 5-15 GHz microwave band of interest are not utilized to carry quantum information (mainly because most superconducting qubit frequencies fall within this range (i.e., fall within the band of interest), and many microwave generators, measuring devices, and microwave components are commercially available in this range), and therefore, multimode resonator_a 115A and multimode resonator_b 115B in embodiments may each have several tens or hundreds of frequency resonance modes (i.e., high density of modes) between 5-15 GHz which can be utilized to process quantum information using the multimode JPC 130.

In general, the density of modes of left-handed transmission line resonators at a given angular resonance frequency ω is proportional to the number of units cells in the resonator and inversely proportional to the low-frequency bound $\omega_{IR}$.

It is to be noted that not all of the multiple resonance modes of multimode resonator_a and multimode resonator_b modes that fall within a certain band of interest, e.g., 5-15 GHz, strongly couple to the JRM at the center, i.e., have an RF-current antinode at the location of the JRM. Hence, the resonance modes which strongly couple to the JRM are a subset (approximately half) of the available resonance modes within the band of interest. Consequently, not all of the resonance modes of multimode resonator_a and multimode resonator_b that fall within the band of interest can be utilized in order to perform three-wave mixing, which forms the basis for the various quantum information processing operations enabled by this multimode device. In other words, the term multiple modes of multimode resonator_a and multimode resonator_b used in this disclosure mainly refers to those which strongly couple to JRM within the band of interest.

In one implementation, the multimode resonator_a 115A and multimode resonator_b 115B may each have between 5 to 20 frequency resonance modes in the range 5-10 GHz which strongly couple to the JRM. In another implementation, the multimode resonator_a 115A and multimode resonator_b 115B may each have between 20-50 frequency resonance modes in the range 5-10 GHz which strongly couple to the JRM. In yet another implementation, the multimode resonator_a 115A and multimode resonator_b 115B may each have 50-100 frequency resonance modes in the range 5-10 GHz which strongly couple to the JRM.

Since the multimode resonator_a 115A and multimode resonator_b 115B may each have multiple resonance modes which strongly couple to the JRM in the range 5-10 GHz (e.g. 5-100 frequency resonance modes), this allows the multimode JPC 130 to be useful in various intriguing applications in the area of quantum information processing beyond the capabilities of standard dual-differential mode JPCs, such as generation of remote entanglement between multiple qubits, generation of multiple pairs of entangled photons, amplification of multiple microwave signals at the quantum limit, and performing unitary frequency conversion between multiple propagating microwave signals at different frequencies.

Figure 4:
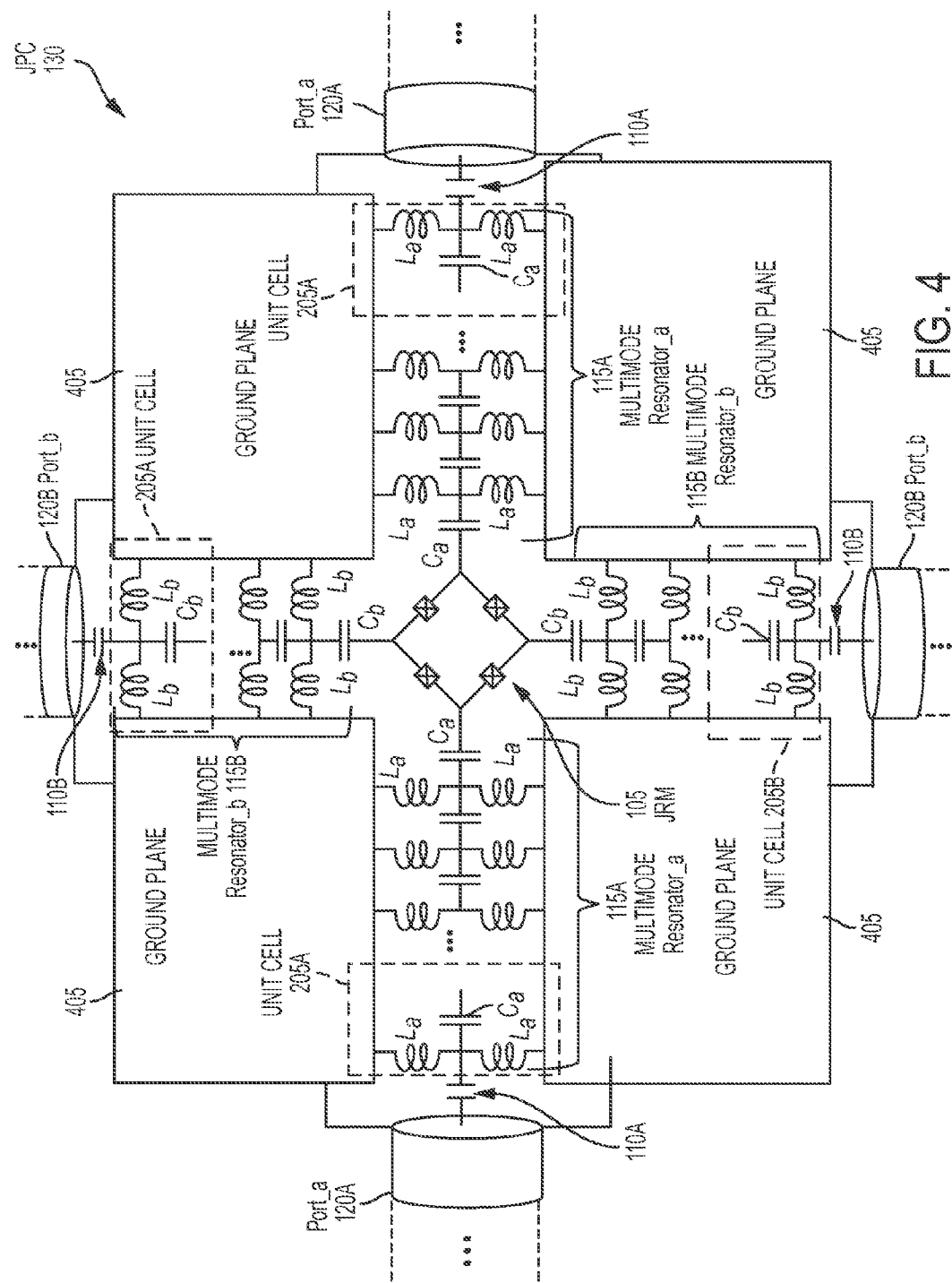
FIG. 4 is a coplanar waveguide implementation of the multimode Josephson parametric converter according to an embodiment.

FIG. 4 is an exemplary coplanar waveguide implementation of the multimode Josephson parametric converter 130 according to an embodiment.

The multimode JPC 130 includes multimode resonator_a 115A (left-handed transmission line) comprising lumped-element inductors $L_a$ (as the inductor $L_l$) and lumped-element capacitors $C_a$ (as the capacitors $C_l$). Similarly, the multimode JPC 130 includes multimode resonator_b 115B (left-handed transmission line) comprising lumped-element inductors $L_b$ (as the inductor $L_l$) and lumped-element capacitors $C_b$ (as the capacitors $C_l$).

The multimode resonator_a 115A (left-handed transmission line) is connected to the left and right nodes of the Josephson ring modulator 150. The multimode resonator_a 115A connects to port_a 120A. In the multimode resonator_a 115A, the unit cell 205A includes two inductors $L_a$ connected to the capacitor $C_a$. One end of the two inductors $L_a$ is connected to each other and the capacitor $C_a$, while the other end of the inductors $L_a$ is connected to the ground plane 405. This configuration of the unit cell 205A repeats N amount of times in the multimode resonator_a 115A as shown in FIG. 4. It should be noted that the use of two inductors in each unit cell is mainly for the purpose of keeping the device symmetric with regard to connection to ground. However, the use of one inductor connected to ground is also contemplated in one implementation.

The multimode resonator_b 115B (left-handed transmission line) is connected to the top and bottom nodes of the Josephson ring modulator 150. The multimode resonator_b 115B connects to port_b 120B. In the multimode resonator_b 115B, the unit cell 205B includes two inductors $L_b$ connected to the capacitor $C_b$. One end of the two inductors $L_b$ is connected to each other and the capacitor $C_b$, while the other end of the inductors $L_b$ is connected to the ground plane 405. In the multimode resonator_b 115B, this configuration of the unit cell 205B repeats M amount of times in the multimode resonator_b 115B as shown in FIG. 4. It should be noted that the use of two inductors in each unit cell is mainly for the purpose of keeping the device symmetric with regard to connection to ground. However, the use of one inductor connected to ground is also contemplated in an implementation.

As discussed in FIG. 2, the ports_a 115A and ports_b 115B may be fed using 180° hybrids 305A and 305B (not shown in FIG. 4). The ports_a 115A and ports_b 115B may be coaxial cables or coplanar waveguides or may be microstrips or striplines with a center conductor and outside conductor separated by a dielectric material. For ports_a 115A, the center conductor connects to the left and right sides of the multimode resonator_a 115A through coupling capacitors 110A, while the outside conductor is connected to the ground plane 405. For ports_b 115B, the center conductor connects to the top and bottom sides of the multimode resonator_b 115B through coupling capacitors 110B, while the outside conductor is connected to the ground plane 405.

Figure 5:
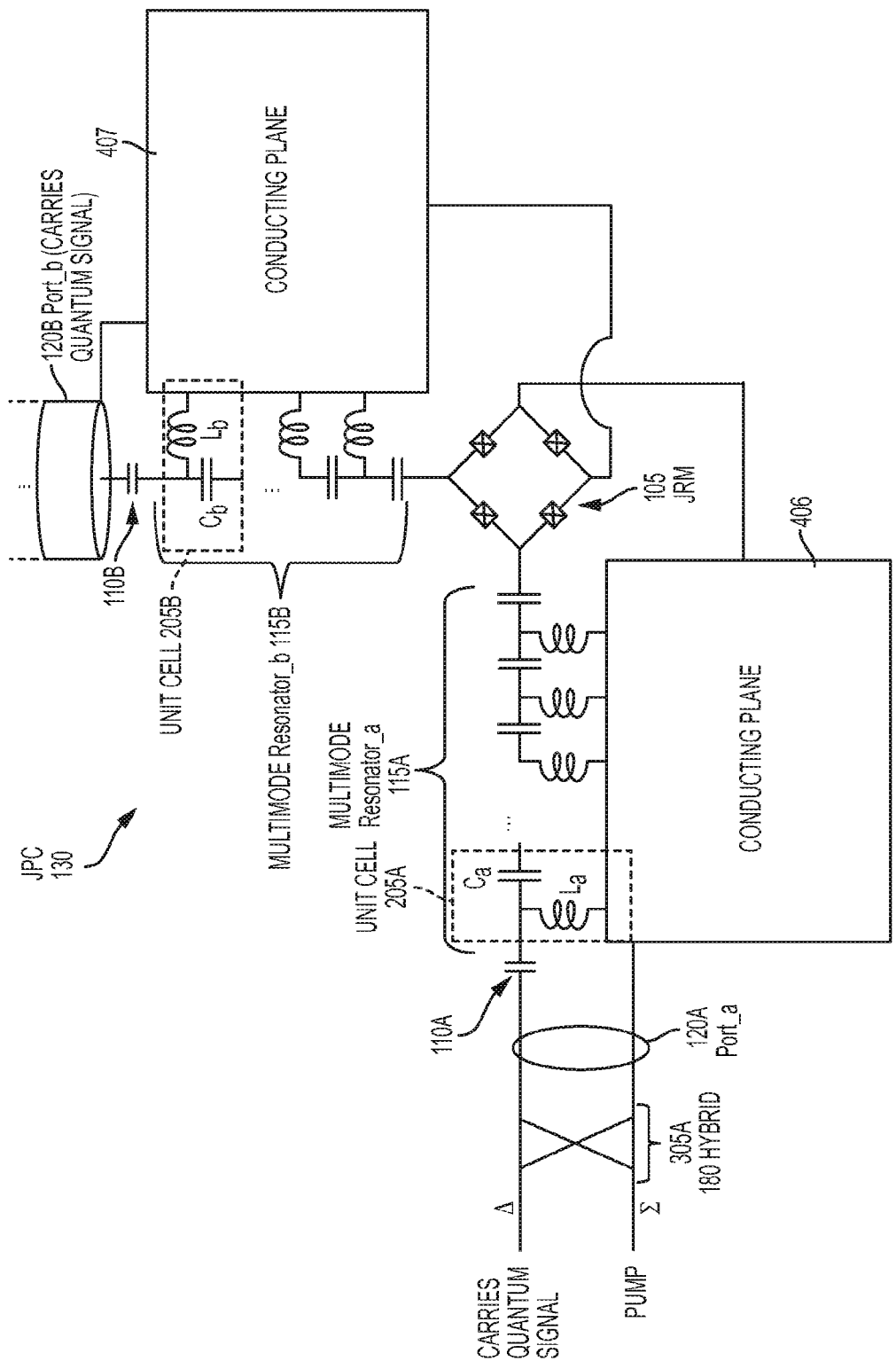
FIG. 5 is a semi-coplanar stripline implementation of the multimode Josephson parametric converter according to an embodiment.

FIG. 5 is an exemplary semi-coplanar stripline implementation of the multimode Josephson parametric converter 130 according to an embodiment.

The multimode JPC 130 includes multimode resonator_a 115A (left-handed transmission line) comprising inductor $L_a$ (as the inductor $L_l$) and capacitors $C_a$ (as the capacitors $C_l$). Similarly, the multimode JPC 130 includes multimode resonator_b 115B (left-handed transmission line) comprising inductors $L_b$ (as the inductor $L_l$) and capacitors $C_b$ (as the capacitors $C_l$).

The lumped-element side of the multimode resonator_a 115A is connected to the left node of the Josephson ring modulator 150, while the right node is connected to the conducting plane 406. The lumped-element side of the multimode resonator_a 115A and the conducting plane 406 connect to the 180 hybrid 305A. In the multimode resonator_a 115A, the unit cell 205A includes inductor $L_a$ connected to the capacitor $C_a$. One end of the inductor $L_a$ is connected to the capacitor $C_a$, while the other end of the inductor $L_a$ is connected to the conducting plane 406. This configuration of the unit cell 205A repeats N amount of times in the multimode resonator_a 115A as shown in FIG. 5. Although FIG. 5 illustrates the left node connected to the lumped-element side of the multimode resonator_a 115A and the right node connected to the conducting plane 406, this configuration can be interchanged such that the lumped-element side of the multimode resonator_a 115A is connected to the right node and the conducting plane 406 is connected to the left node.

The lumped-element side of the multimode resonator_b 115B is connected to the top node of the Josephson ring modulator 150, while the bottom node is connected to the conducting plane 407. The lumped-element side of the multimode resonator_b 115B and conducting plane 407 connect to the port_b 115B. In the multimode resonator_b 115B, the unit cell 205B includes inductor $L_b$ connected to the capacitor $C_b$. One end of the inductor $L_b$ is connected to the capacitor $C_b$, while the other end of the inductor $L_b$ is connected to the conducting plane 407. This configuration of the unit cell 205B repeats M amount of times in the multimode resonator_b 115B as shown in FIG. 5. Although FIG. 5 illustrates the top node connected to the lumped-element side of the multimode resonator_b 115B and the bottom node connected to the conducting plane 407, this configuration can be interchanged such that the lumped-element side of the multimode resonator_b 115B is connected to the top node and the conducting plane 407 is connected to the bottom node.

Figure 6:
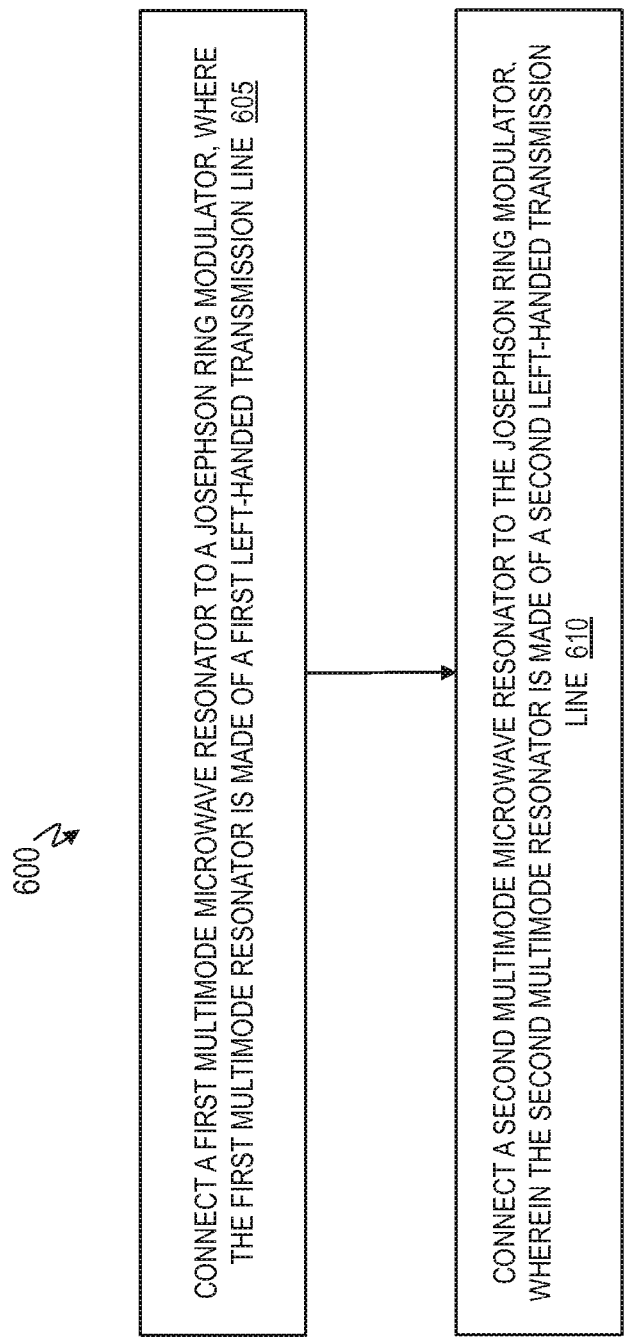
FIG. 6 is a flow chart of a method of configuring a microwave apparatus according to an embodiment.

FIG. 6 is a method of configuring a microwave apparatus (such as multimode JPC 130) according to an embodiment. Reference can be made to FIGS. 1-5.

At block 605, a first multimode resonator (i.e., multimode resonator_a 115A) is connected to a Josephson ring modulator 150, where the first multimode resonator is made of a first left-handed transmission line.

At block 610, a second multimode resonator (i.e., multimode resonator_b 115B) is connected to the Josephson ring modulator 150, where the second multimode resonator is made of a second left-handed transmission line.

The first multimode resonator (i.e., multimode resonator_a 115A) comprises a plurality of first resonance modes which strongly couple to the JRM within a certain frequency band of interest, and the second multimode resonator (i.e., multimode resonator_b 115B) comprises a plurality of second resonance modes which strongly couple to the JRM within the same frequency band of interest.

A number of the plurality of first resonance modes in the first multimode resonator which strongly couple to the JRM within a certain frequency band of interest is equal to a number of a plurality of second resonance modes in the second multimode resonator which strongly couple to the JRM within the same frequency band of interest. For example, the number of frequency resonance modes which strongly couple to the JRM within a certain frequency band of interest is equal in multimode resonator_a 115A and multimode resonator_b 115B.

The number of the plurality of first resonance modes in the first multimode resonator which strongly couple to the JRM within a certain frequency band of interest does not equal to the number of the plurality of second resonance modes in the second multimode resonator which strongly couple to the JRM within the same frequency band of interest. For example, the multimode resonator_a 115A or the multimode resonator_b 115B may have within a certain frequency band of interest more frequency resonance modes which strongly couple to the JRM than the other.

The first multimode resonator_a 115A comprises N amount of first unit cells 205A, and the second multimode resonator_b 115B comprises M amount of second unit cells 205B. Neither N nor M is equal to zero. In one implementation, N equals M, and in another implementation N does not equal M.

Each of the first unit cells 205A and each of the second unit cells 205B respectively comprises a capacitor ($C_a$, $C_b$) connected to one end of an inductor ($L_a$, $L_b$), while another end of the inductor ($L_a$, $L_b$) is connected to ground 405 or conducting planes 406, 407, as depicted is FIGS. 2, 4 and 5.

The Josephson ring modulator 150 comprises a first pair of nodes (e.g., left and right nodes JRM 150) opposite one another and a second pair of nodes (e.g., top and bottom nodes of the JRM 150) opposite one another. The first multimode resonator_a 115A is connected to the first pair of nodes. One of the first pair of nodes is connected to the lumped-element side of the resonator, and the conducting plane 406 is connected to another one of the first pair of nodes, as depicted in FIG. 5. The second multimode resonator_b 115B is connected to the second pair of nodes. One of the second pair of nodes is connected to the lumped-element side of the resonator and the conducting plane 407 is connected to another one of the second pair of nodes, as depicted in FIG. 5.

Each of the first unit cells 205A and each of the second unit cells 205B respectively comprises a first inductor (first $L_a$, first $L_b$), a second inductor (second $L_a$, second $L_b$), and a capacitor ($C_a$, $C_b$), as depicted in FIG. 4. The first ends of the first inductor and the second inductor are connected together, while second ends of the first inductor and the second inductor are connected to ground, and the capacitor is connected to the first ends, as depicted in FIG. 4.

The Josephson ring modulator 150 comprises a first pair of nodes opposite one another and a second pair of nodes opposite one another in a Wheatstone bridge. The first multimode resonator_a 115A is connected to the first pair of nodes, and the second multimode resonator_b 115B is connected to the second pair of nodes.

The first unit cells are connected to one another in series, and the second unit cells are connected to one another in series.

In one implementation, a capacitance and an inductance in each of the first unit cells 205 (in the multimode resonator_a 115A) are different from a capacitance and an inductance in each of the second unit cells (in the multimode resonator_b 115B). Since the unit cells 205A in the multimode resonator_a 115A are different from the unit cells 205B in the multimode resonator_b 115B, the multimode resonator_a 115A has different resonance modes and resonance frequencies than the multimode resonator_b 115B.

In another implementation, the capacitance and the inductance in each of the first unit cells (in the multimode resonator_a 115A) match the capacitance and the inductance in each of the second unit cells (in the multimode resonator_b 115B).

The lumped-element inductances and capacitances used in each multimode resonator can vary from one unit cell to another. Such perturbation to the periodic structure of the multimode resonator can be used in order to alter the frequency spacing between certain eigenmodes of the multimode resonator.

The lumped-element inductances used in the design of the left-handed transmission lines of the multimode resonators, e.g. $L_a$ and $L_b$, can be implemented using narrow superconducting wires in a meander configuration. The total inductance of the superconducting wire may be a combination of geometric and kinetic inductances. The lumped-element inductances used in the design of the left-handed transmission lines of the multimode resonators can also be implemented as an array of large Josephson Junctions.

The lumped-element capacitances used in the design of the left-handed transmission lines of the multimode resonators, e.g. $C_a$ and $C_b$, can be implemented as interdigitated capacitors or plate capacitors with a dielectric layer deposited between two electrodes along the center conductor of the left-handed transmission line.

According to an embodiment, the multimode Josephson parametric converter 130 is a multimode quantum-limited amplifier that operates in the microwave domain and can be used in quantum information processing and quantum computing. The multimode JPC 130 is a device that can amplify multiple signals in parallel. The multimode JPC 130 can also be utilized to remotely entangle multiple superconducting qubits. Additionally, multimode JPC 130 has benefits in scalable quantum computing architectures over other alternatives. The multimode JPC 130 can also play a major role in quantum computation schemes that use microwave photons as qubits.

There are not any state-of-the-art devices that have similar capabilities while supporting multiple microwave eigenmodes within the frequency range of interest between 5-15 GHz. A state-of-the-art Josephson parametric converter can support only two eigenmodes within the same frequency range.

Various beneficial applications of utilizing the multimode Josephson parametric converter 130 are discussed below. For ease of understanding, sub-titles or sub-headings are provided below. The sub-titles are for explanation purposes and not limitation.

Multimode Quantum Limited Amplifier

The multimode Josephson parametric converter 130 is configured to operate as a multimode quantum limited amplifier. The multimode Josephson parametric converter 130 is configured to amplify multiple quantum signals at different frequencies in parallel (i.e., simultaneously) at the quantum limit. For example, the multiple quantum signals may be multiple Signal (S) quantum signals (corresponding to resonance frequencies on multimode resonator_a 115A) and Idler (I) quantum signals (corresponding to resonance frequencies on multimode resonator_b 115B) input respectively into the multimode resonator_a 115A via port_a 120A and into multimode resonator_b 120B via port_b 115B.

The multimode Josephson parametric converter 130 is configured to select which input signals (i.e., input quantum signals) are amplified in reflection and which are reflected off the JPC 130 without gain.

As an example, consider a multimode JPC 130 with multimode resonator_a 115A and multimode resonator_b 115B having resonance frequencies $f_1^a$, $f_2^a$, $f_3^a$, $f_4^a$, ... and $f_1^b$, $f_2^b$, $f_3^b$, $f_4^b$, ... which couple to the JRM 105 respectively. By simultaneously pumping the multimode JPC 130 (device) with three pump tones whose frequencies $f_1^P$, $f_2^P$, $f_2^P$ satisfy the relations $f_1^P=f_1^a+f_1^b$, $f_2^P=f_2^a+f_2^b$, $f_4^P=f_4^a+f_4^b$, the input quantum signals on port_a 120A and port_b 120B at frequencies $f_1^a$, $f_2^a$, $f_4^a$ and $f_1^b$, $f_2^b$, $f_4^b$ respectively are amplified (by gain G) in reflection, whereas input signals at frequencies $f_3^a$, $f_3^b$ are reflected off the JPC 130 without gain G. Amplified in reflection means that the respective quantum signals at frequencies $f_1^a$, $f_2^a$, $f_4^a$ and frequencies $f_1^b$, $f_2^b$, $f_4^b$ are amplified back through their respective port_a 120A and port_b 120B in which the multiple quantum signals were initially input.

According to an implementation, in order for the multimode JPC 130 device to operate properly as an amplifier (i.e., avoid pump depletion effects, such as decrease in the dynamic range), the pump tones are to satisfy the stiff pump approximation, where the applied pump tones are nonresonant with the resonance modes of the JPC 130. In other words, the pump frequencies $f_1^P$, $f_2^P$, $f_3^P$, . . . should not coincide with the frequency resonance modes of multimode resonator_a 115A and multimode resonator_b 115B.

According to one implementation, in order to prevent frequency collisions between the frequency of the pump (P) tones that need to be applied in order to amplify certain resonance frequencies (of the multimode resonators 115A and 115B) and the high resonance frequencies of the multimode resonators 115A and 115B, certain mode engineering techniques can be applied in the design of the multimode resonators 115A and 115B. One example of such a mode engineering technique is to reduce the number of unit cells 205A and 205B in the multimode resonators 115A and 115B, respectively, in order to reduce the density of modes in the frequency band at which the pump frequencies need to be applied. It is noted that this measure can also shift the resonance frequencies which the operators are interested in amplifying, and as a result, shift the pump frequencies as well. Another example is to perturb (i.e., change) the periodic structure of the multimode resonators 115A and 115B by modifying the inductance (e.g., of inductors $L_a$, $L_b$) and/or the capacitance (of capacitors $C_a$, $C_b$) of certain unit cells 205A, 205B.

According to one implementation, it is further noted that not all of the frequency resonance modes of multimode resonators 115A and 115B are expected to have an RF-current antinode at the JRM 105 position that is required for amplification. Therefore, the frequency resonance modes that can be amplified may (only) be a subgroup of all the frequency resonance modes of the multimode JPC 130 (device) in one implementation.

Figure 7:
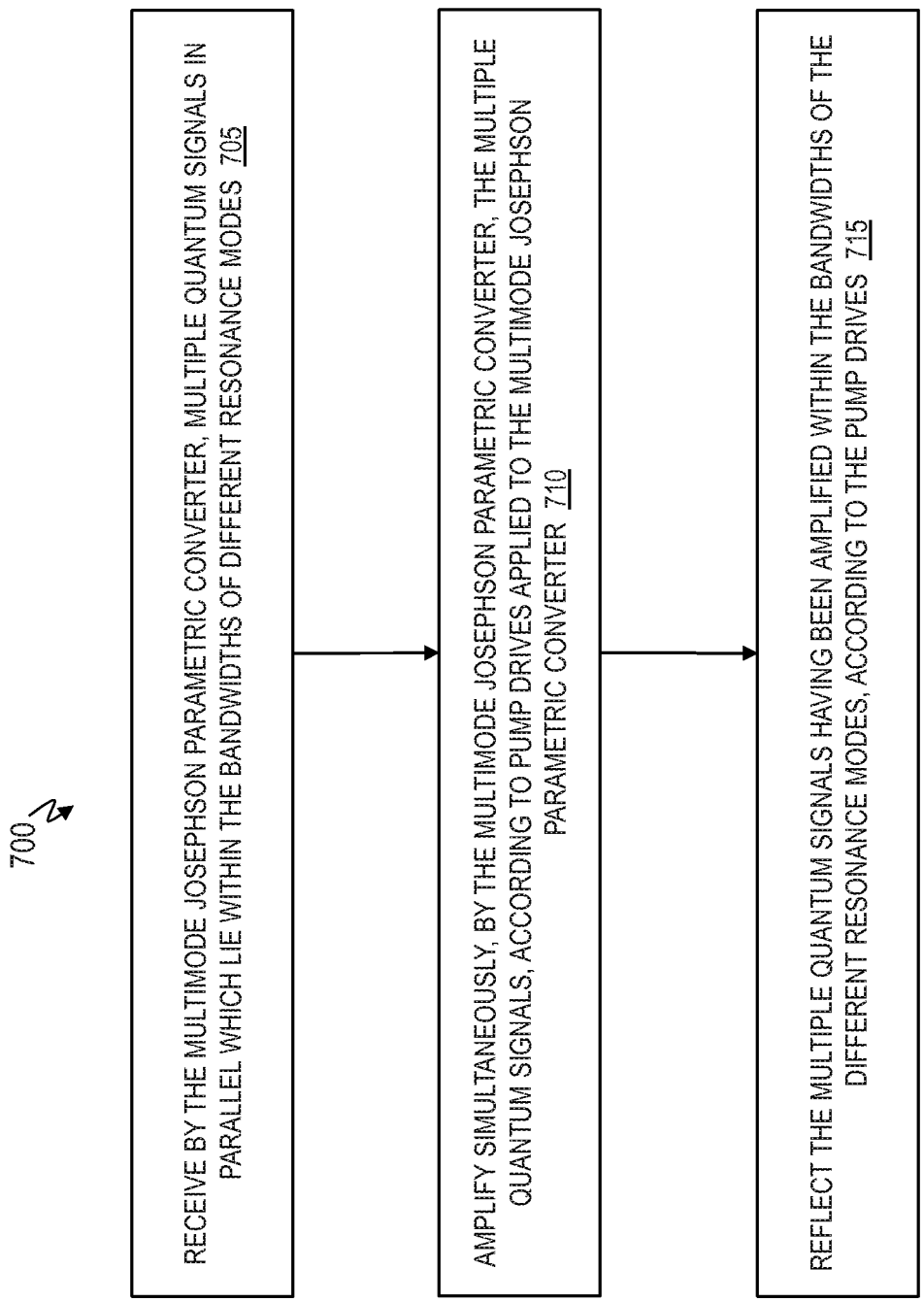
FIG. 7 is a flow chart of a method of operating the multimode Josephson parametric converter as a multimode quantum limited amplifier according to an embodiment.

FIG. 7 is a flow chart 700 of a method of operating the multimode Josephson parametric converter 130 as a multimode quantum limited amplifier according to an embodiment.

At block 705, the multimode resonator_a 115A and the multimode resonator_b 115B (in the multimode Josephson parametric converter 130) receive multiple quantum signals in parallel which lie within the bandwidths of different resonance modes via port_a 120A and port_b 120B.

At block 710, the multimode Josephson parametric converter 130 amplifies simultaneously the multiple quantum signals, according to pump drives (tones) applied to, e.g., port_a 120A connected to multimode resonator_a 115A of the multimode Josephson parametric converter 130.

At block 715, the multimode parametric converter 130 is configured to reflect the amplified multiple quantum signals which lie within the bandwidths of the different resonance frequencies, according to the applied pump drives. The amplified quantum signals are reflected back to the ports 120A and 120B on which they were input.

A first group of the different resonance modes of the first multimode resonator_a 115A configured to resonate at the first group of the different resonance frequencies (i.e., the first group of the different resonance frequencies correspond to the resonance modes for the multimode resonator_a 115A). The first multimode resonator_a 115A is a first left-handed transmission line.

A second group of the different resonance modes of the second multimode resonator_b 115B configured to resonate at the second group of the different resonance frequencies (i.e., the second group of the different resonance frequencies correspond to the resonance modes for the multimode resonator_b 115B). The second multimode resonator_b 115 is a second left-handed transmission line.

Each of the pump drives (input into the JPC 130) is a frequency sum of one of the different resonance frequencies in the first group and one of the different resonance frequencies in the second group which couple to the JRM 105, such that the multiple quantum signals at the one of the first group and the one of the second group are amplified.

A first pump signal is a first frequency sum (e.g., $f_1^P=f_1^a+f_1^b$) of a first resonance frequency in the first group (e.g., $f_1^a$) plus a first resonance frequency in the second group (e.g., $f_1^b$). A second pump signal is a second frequency sum of a second resonance frequency in the first group plus a second resonance frequency in the second group. A last pump signal is a last frequency sum of a last resonance frequency in the first group plus a last resonance frequency in the second group. It is noted that there are many more combinations of frequencies that can be used as the frequency sum, and the example frequency sum (e.g., $f_1^P=f_1^a+f_1^b$) is provided for explanation purposes. For example, another frequency sum may be $f_{12}^P=f_1^a+f_2^b$, where the first resonance frequency in the first group may be $f_1^a$ and the second resonance frequency in the second group may be $f_2^b$.

At least one of the first through last resonance frequencies in the first group and at least one of the first through last resonance frequencies in the second group is the same. At least one of the first through last resonance frequencies in the first group and the first through last resonance frequencies in the second group is different.

The multiple quantum signals at the different frequencies range from about 5-15 GHz. The multimode Josephson parametric converter is configured to amplify simultaneously (or nearly simultaneously) the multiple quantum signals which lie within the bandwidths of the different resonance modes via the first multimode resonator_a 115A and the second multimode resonator_b 115B, where the first and second multimode resonators 115A, 115B are coupled to a dispersive nonlinear medium 105.

Remote Entanglement of Multiple Qubits by Measurement Scheme

Figure 8:
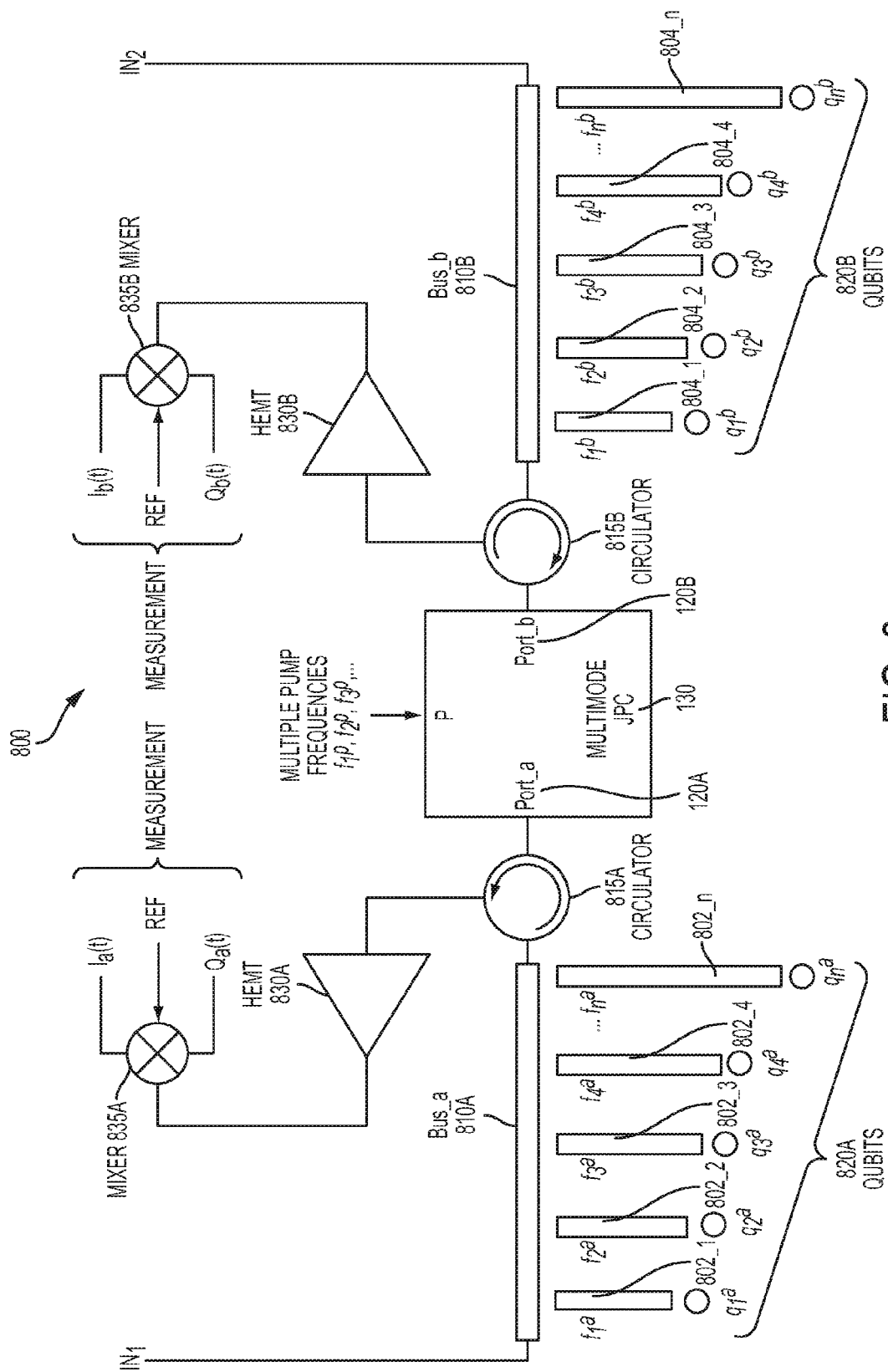
FIG. 8 is a schematic of a microwave quantum device for remote entanglement of multiple qubits by measurement using the multimode Josephson parametric converter according to an embodiment.

FIG. 8 is a schematic of a microwave quantum device 800 for remote entanglement of multiple qubits by measurement using the multimode JPC 130 according to an embodiment. For the sake of simplicity, the details of the multimode JPC 130 are not shown in FIG. 8. For details of the multimode JPC 130, reference can be made to FIGS. 1-6 discussed herein.

In FIG. 8, the multimode JPC 130 has port_a 115A connected to a circulator 815A and port_b 115B connected to circulator 815B. The pump tones/drives are multiple pump frequencies input into the multimode JPC 130 as discussed further below. Output field quadratures $I_a(t)$ and/or $Q_a(t)$ are measured via mixer 835A, high electron mobility transistor (HEMT) 830A, the circulator 815A (assumed to be lossless), and multimode JPC 130. Similarly, output field quadratures $I_b(t)$, and/or $Q_b(t)$ are measured via mixer 835B, high electron mobility transistor (HEMT) 830B, the circulator 815B (assumed to be lossless), and multimode JPC 130.

It is assumed that the resonance frequencies ($f_1^a$, $f_2^a$, $f_3^a$, ..., $f_n^a$) of the multimode resonator_a 115A of port_a 120A that couple to the JRM 105 (within the JPC 130) coincide with (i.e., are the same as) the readout frequencies of the readout resonators 802_1-802_n coupled to bus_a 810A. The readout resonators 802_1-802_n may be capacitively coupled to the bus_a 810A.

It is assumed that the resonance frequencies ($f_1^b$, $f_2^b$, $f_3^b$, ..., $f_n^b$) of the multimode resonator_b 115B of port_b 120B that couple to the JRM 105 coincide with the readout frequencies of the readout resonators 804_1-804_n coupled to bus_b 810B. The readout resonators 804_1-804_n may be capacitively coupled to the bus_a 810B.

The qubits 820A include $q_1^a$, $q_2^a$, $q_3^a$, ... $q_n^a$, each capacitively coupled to its own readout resonator 802_1, 802_2, 802_3, ... 802_n. Similarly, the qubits 820B include $q_1^b$, $q_2^b$, $q_3^b$, ... $q_n^b$, each capacitively coupled to its own readout resonator 804_1, 804_2, 804_3, ... 804_n. In FIG. 8, applying the frequency $f_1^a$ at input 1 (IN$_1$) has the dual effect of causing readout resonator 802_1 to read out its qubit $q_1^a$ and causing the multimode resonator_a 115A to resonate at its resonance frequency $f_1^a$. Analogously, applying the frequencies ($f_1^a$, $f_2^a$, $f_3^a$, ..., $f_n^a$) in parallel at input 1 (IN$_1$) has the dual effect of causing readout resonators 802_1, 802_2, 802_3, ..., 802_n to read out their capacitively coupled qubit $q_1^a$, $q_2^a$, $q_3^a$, ... $q_n^a$ respectively and causing the multimode resonator_a 115A to resonate at its resonance frequencies ($f_1^a$, $f_2^a$, $f_3^a$, ..., $f_n^a$). Each readout resonator 802 respectively shares the same resonance frequency as one of the resonance modes in the multimode resonator_a 115A, such that a signal with this same frequency causes both to resonate.

Similarly, applying the frequency $f_1^b$ at input 2 (IN$_2$) has the dual effect of causing readout resonator 804_1 to read out its qubit $q_1^b$ and causing the multimode resonator_b 115B to resonate at its resonance frequency $f_1^b$. Analogously, applying the frequencies ($f_1^b$, $f_2^b$, $f_3^b$, ..., $f_n^b$) in parallel at input 2 (IN$_2$) has the dual effect of causing readout resonators 804_1, 804_2, 804_3, ..., 804_n to read out their capacitively coupled qubit $q_1^b$, $q_2^b$, $q_3^b$, ... $q_n^b$ respectively and causing the multimode resonator_b 115B to resonate at its resonance frequencies ($f_1^b$, $f_2^b$, $f_3^b$, ..., $f_n^b$) Each readout resonator 804 respectively shares the same resonance frequency as one of the resonance modes in the multimode resonator_b 115B, such that a signal with this same frequency causes both to resonate.

The multimode JPC 130 is configured to remotely entangle pairs of qubits (individually from qubits 820A and 820B) coupled to buses 810A and 810B via measurement, by applying multiple pump tones to the multimode JPC 130 where the pump tone frequencies ($f_1^P$, $f_2^P$, $f_3^P$, ..., $f_m^P$) correspond to the frequency sum of the readout frequencies of the pairs of qubits in qubits 820A and 820B that are to be entangled. With respect to applying the frequencies ($f_1^a$, $f_2^a$, $f_3^a$, ..., $f_n^a$) and ($f_1^b$, $f_2^b$, $f_3^b$, ..., $f_n^b$) and applying the pump tone frequencies ($f_1^P$, $f_2^P$, $f_3^P$, ..., $f_m^P$), it should be appreciated that the index m is larger than the index n, because there are more combinations for the pump tone frequencies than individual resonance frequencies. For explanation purposes, a few examples are provided for illustration and not limitation.

EXAMPLE 1

In this case, the microwave quantum device 800 is entangling the qubit pairs ($q_i^a$, $q_i^b$) where i ∈ {1, 2, ... n} and $f_i^a \neq f_i^b$. Accordingly, the applied pump frequencies are given by $f_i^P = f_i^a + f_i^b$. In this example, each of the qubits 820A is entangled respectively with its corresponding qubit in qubits 820B, such that, e.g., there are entangled qubit pairs ($q_1^a$, $q_1^b$), ($q_2^a$, $q_2^b$), ($q_3^a$, $q_3^b$) through entangled qubit pair ($q_n^a$, $q_n^b$).

EXAMPLE 2

In this case, microwave quantum device 800 is entangling the qubit pairs ($q_i^a$, $q_j^b$) where i, j ∈ {1, 2, ... n} and $f_i^a \neq f_i^b$ given by $f_{ij}^P = f_i^a + f_j^b$.

It is noted that entanglement by the microwave quantum device 800 is not limited to pairs of qubits. For example, the microwave quantum device 800 is configured to entangle three qubits $q_1^a$, $q_2^b$, $q_3^b$ coupled to readout resonators 802_1, 804_2, 804_3 respectively with frequencies $f_1^a$, $f_2^b$, $f_3^b$ by applying two pump tones at frequencies $f_{12}^P = f_1^a + f_2^b$ and $f_{13}^P = f_1^a + f_3^b$ sequentially. Thus, using this method of entanglement, the microwave quantum device 800 is configured to remotely entangle n different qubits by applying sequentially n−1 pumps that satisfy the sum condition of the readout frequencies of those qubits.

Figure 9:
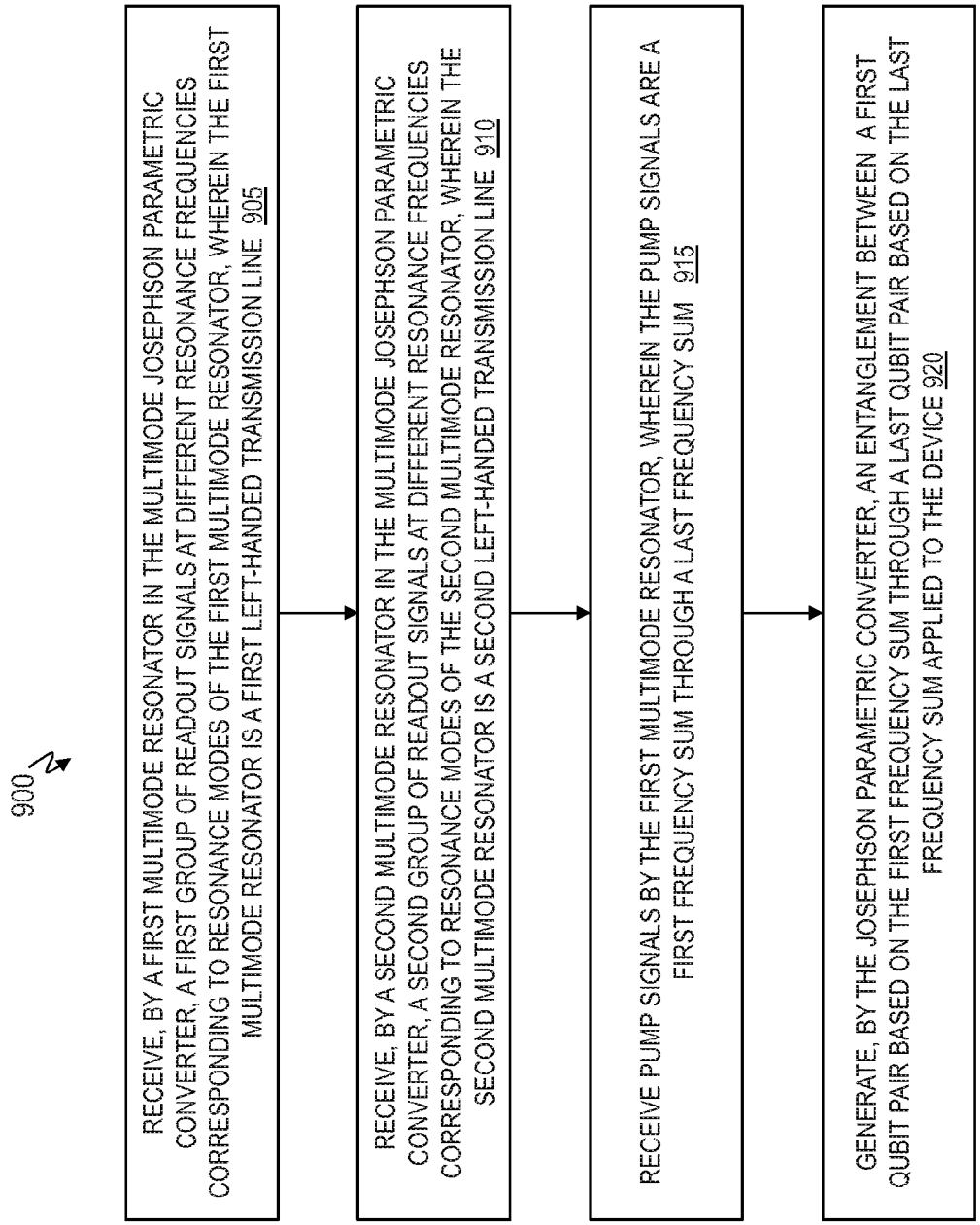
FIG. 9 is a flow chart of a method of remote entanglement of multiple qubits by measurement according to an embodiment.

FIG. 9 is a flow chart 900 of a method of remote entanglement of multiple qubits by measurement according to an embodiment.

At block 905, the first multimode resonator_a 115A in the multimode Josephson parametric converter 130 is configured to receive a first group of readout signals at different resonance frequencies ($f_1^a$, $f_2^a$, $f_3^a$, ..., $f_n^a$) or lie within the bandwidths of resonance modes of the first multimode resonator_a 115A, where the first multimode resonator is a first left-handed transmission line.

At block 910, the second multimode resonator_b 115B in the multimode Josephson parametric converter 130 is configured to receive a second group of readout signals at different resonance frequencies ($f_1^b$, $f_2^b$, $f_3^b$, ..., $f_n^b$) or lie within the bandwidths of resonance modes of the second multimode resonator, where the second multimode resonator is a second left-handed transmission line.

At block 915, the second multimode resonator_b 115B is configured to receive pump signals ($f_1^P$, $f_2^P$, $f_3^P$, ..., $f_n^P$), where the pump drives are a first (pump) frequency sum (e.g., $f_1^P = f_1^a + f_1^b$), a second (pump) frequency sum (e.g., $f_2^P = f_2^a + f_2^b$), through a last (pump) frequency sum (e.g., $f_n^P = f_n^a + f_n^b$). It is noted that n denotes the last number of the particular series of items. As understood by one skilled in the art, there are many other combinations that may be utilized and the example frequency sums are only for explanation purposes. For example, another frequency sum may be $f_{23}^P = f_2^a + f_3^b$, $f_{1n}^P = f_1^a + f_n^b$, and so forth.

At block 920, the Josephson parametric converter 130 is configured to generate a first qubit pair (e.g., ($q_1^a$, $q_1^b$)) based on the first frequency sum, a second qubit pair (e.g., ($q_2^a$, $q_2^b$)) based on the second frequency sum, through a last qubit pair (e.g., ($q_n^a$, $q_n^b$)) based on the last frequency sum. As understood by one skilled in the art, these example qubit pairs are illustrated only for explanation purposes, and many other combinations of qubit pairs can be matched. For example, other qubit pairs may include ($q_1^a$, $q_n^b$), ($q_n^a$, $q_2^b$), and so forth.

The first frequency sum is a summation of one resonance frequency of the first group plus one resonance frequency of the second group, where the second frequency sum is a summation of another resonance frequency of the first group plus another resonance frequency of the second group, and where the last frequency sum is a summation of yet another resonance frequency of the first group plus yet another resonance frequency of the second group. It is understood that there are numerous combinations, and embodiments are not meant to be limited.

The first group of readout signals is received from first readout resonators 802, and the first readout resonators 802 are coupled to first qubits 820A. The second group of readout signals is received from second readout resonators 804, and the second readout resonators 804 are coupled to second qubits 820B.

One qubit (e.g., $q_1^a$) in the first qubits 820A has been readout at the one resonance frequency of the first group and one qubit (e.g., $q_1^b$) in the second qubits 820B has been readout at the one resonance frequency of the second group, such that the first qubit pair (e.g., ($q_1^a$, $q_1^b$)) is the one qubit in the first qubits and the one qubit in the second qubits, in response to the first frequency sum of the pump signals. Another qubit (e.g., $q_2^a$) in the first qubits 820A has been readout at the another resonance frequency of the first group and another qubit (e.g., $q_2^b$) in the second qubits 820B has been readout at the another resonance frequency of the second group, such that the second qubit pair (e.g., ($q_2^a$, $q_2^b$)) is the another qubit in the first qubits 820A and the another qubit in the second qubits 820B, in response to the second frequency sum of the pump signals. Also, yet another qubit (e.g., $q_n^a$) in the first qubits 820A has been readout at the yet another resonance frequency of the first group and yet another qubit (e.g., $q_n^b$) in the second qubits 820B has been readout at the yet another resonance frequency of the second group, such that the third qubit pair (e.g., ($q_n^a$, $q_n^b$)) is the yet another qubit in the first qubits and the yet another qubit in the second qubits, in response to the last frequency sum of the pump signals. As noted herein, combinations are pointed out for ease of understanding, but embodiments are not limited to the example combination. It is understood that there are many more combinations. Moreover, there may be every pair combination taken from resonator_a 115A and resonator_b 115B, where the pump frequency (i.e., frequency sum) needs to have two indices (one for the qubit on bus_a 810A and one for the qubit on bus_b 810B).

The first readout resonators 802_1 through 802_n have readout resonator frequencies ($f_1^a$, $f_2^a$, $f_3^a$, ..., $f_n^a$) that coincide with the resonance frequencies of the first multimode resonator_1 115A. The second readout resonators 804_1 through 804_n have readout resonator frequencies ($f_1^b$, $f_2^b$, $f_3^b$, ..., $f_n^b$) that coincide with the resonance frequencies of the second multimode resonator_b 115B.

Both the resonance modes of the first multimode resonator and the readout resonator frequencies of the first readout resonator range from about 5-15 GHz. Both the resonance modes of the second multimode resonator and the readout resonator frequencies of the second readout resonator range from about 5-15 GHz.

In the section of remote entanglement of multiple qubits by measurement scheme, the qubits 820A, 820B are read out first and then the JPC 130 entangles pairs of qubits coupled to readout resonators and buses located on either side (port) of the multimode JPC 130.

Remote Entanglement Scheme of Multiple Qubits by Applying Entangled Photons to Readout the State of the Multiple Qubits The sections (for the generation of multiple pairs of entangled photons and the remote entanglement of multiple qubits by applying entangled photons) generate entangled photons first, such that the entangled photons can be further utilized, such as to readout out qubits. The order of these sections (the generation of multiple pairs of entangled photons and the remote entanglement of multiple qubits by applying entangled photons) is reversed compared to the section of remote entanglement of multiple qubits by measurement scheme.

Figure 10:
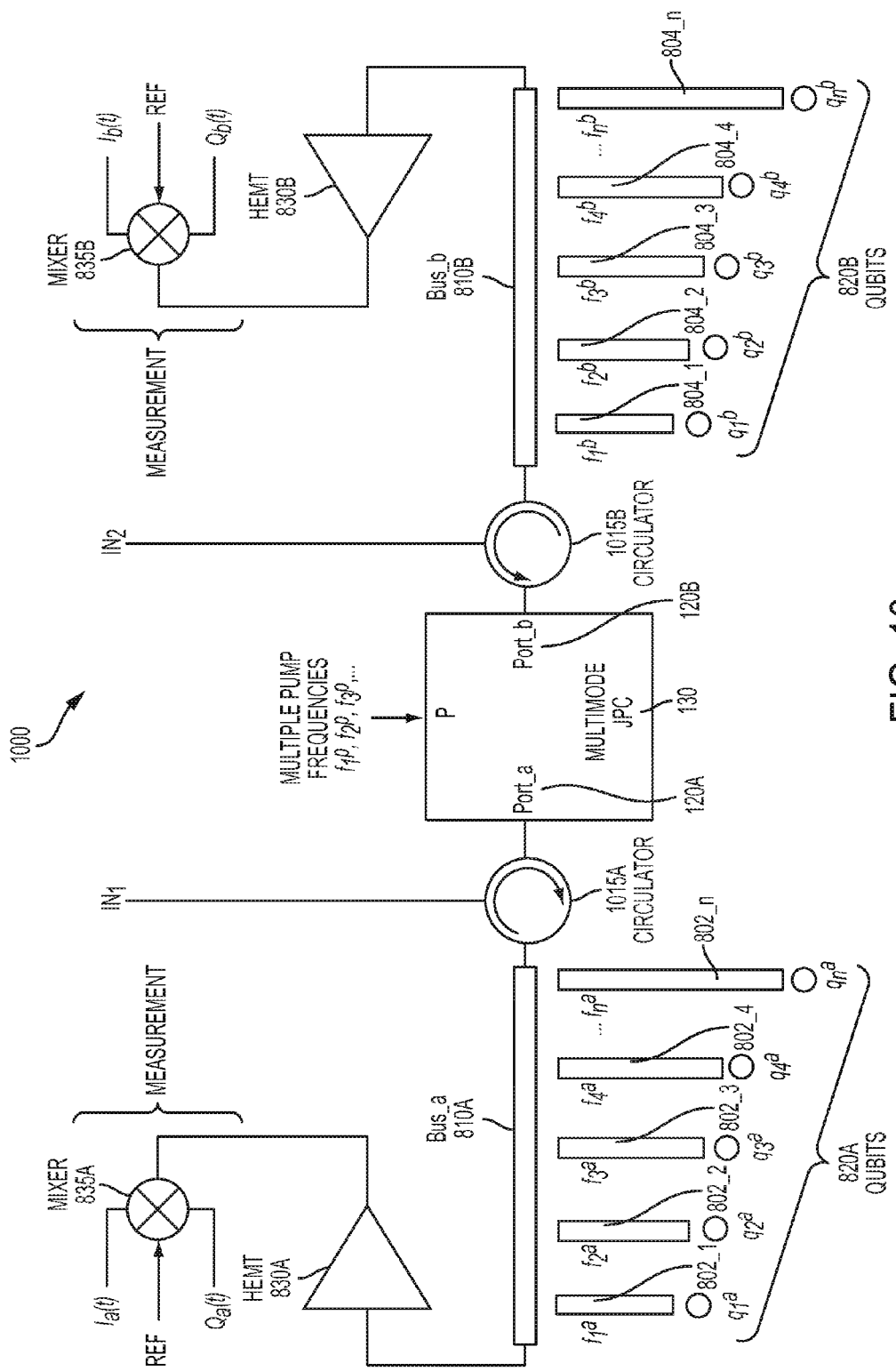
FIG. 10 is a schematic of a microwave quantum device for remote entanglement of multiple qubits by applying entangled photons to readout the state of the multiple qubits using the multimode Josephson parametric converter according to an embodiment.

FIG. 10 is a schematic of a microwave quantum device 1000 for remote entanglement of multiple qubits by applying entangled photons to readout the state of the multiple qubits using the multimode JPC 130 according to an embodiment. For the sake of simplicity, the details of the multimode JPC 130 are not shown in FIG. 10. For details of the multimode JPC 130, reference can be made to FIGS. 1-6 discussed herein. Also, certain components of microwave device 800 are included in the microwave device 1000. However, the ports of the circulators are different as well as the rotation.

In FIG. 10, input $IN_1$ connects directly to circulator 1015A, such that the circulator 1015A first transmits the input signal of input $IN_1$ directly to port_a 120A. Similarly, input $IN_2$ connects directly to circulator 1015B, such that the circulator 1015B first transmits the input signal of input $IN_2$ directly to port_b 120B.

The reflected output of port_a 120A is transmitted to the bus_a 810A via the circulator 1015A and then to the measurement equipment for measuring the output field quadratures $I_a(t)$ and/or $Q_a(t)$. Similarly, the reflected output of port_b 120B is transmitted to the bus_b 810B via the circulator 1015B and then to the measurement equipment for measuring the output field quadratures $I_b(t)$ and/or $Q_b(t)$.

In the microwave quantum device 1000, the resonance frequencies of the multimode resonator_a 115A of (connected to) port_a 120A that couple to the JRM 105 coincide with the readout frequencies of the readout resonators 802 coupled to bus_a 810A, i.e., $f_1^a$, $f_2^a$, $f_3^a$, ..., $f_n^a$. Similarly, the resonance frequencies of the resonator_b 115B of (connected to) port_b 120B that couple to the JRM 105 coincide with the readout frequencies of the readout resonators 804 coupled to bus_b 810B, i.e. $f_1^b$, $f_2^b$, $f_3^b$, ..., $f_n^b$. Accordingly, the microwave quantum device 1000 is configured to remotely entangle pairs of qubits coupled to bus_a 810A and bus_b 810B by applying entangled pairs of photons generated by the JPC 130 at the corresponding readout frequencies. This can be achieved by applying multiple pump tones to the multimode JPC 130 whose frequencies $f_1^p$, $f_2^p$, $f_3^p$, ..., $f_m^p$ correspond to the frequency sum of the readout frequencies of the pairs of qubits that are to be entangled.

EXAMPLE 1

In order for the microwave quantum device 1000 to entangle the qubit pairs ($q_i^a$, $q_i^b$) where $i \in \{1, 2, \ldots n\}$ and $f_i^a \neq f_i^b$, the microwave quantum device 1000 receives the applied pump drives whose frequencies are given by $f_i^p = f_i^a + f_i^b$.

EXAMPLE 2

In order for the microwave quantum device 1000 to entangle the qubit pairs ($q_i^a$, $q_j^b$) where $i, j \in \{1, 2, \ldots n\}$ and $f_i^a \neq f_j^b$, the microwave quantum device 1000 receives the applied pump drives whose frequencies are given by $f_{ij}^p = f_i^a + f_j^b$.

It is noted that entanglement via microwave quantum device 1000 is not limited to pairs of qubits. For example, the microwave quantum device 1000 is configured to entangle three qubits $q_1^a$, $q_2^b$, $q_3^b$ coupled to readout resonators 802_1, 804_2, 804_3 with frequencies $f_1^a$, $f_2^b$, $f_3^b$ by applying two pump tones at frequencies $f_{12}^p = f_1^a + f_2^b$ and $f_{13}^P = f_1^a + f_3^b$ sequentially. Thus, using this method of entanglement, the microwave quantum device 1000 is configured to remotely entangle n different qubits by applying sequentially n−1 pumps that satisfy the sum condition of the readout frequencies of those qubits.

Generation of Multiple Pairs of Entangled Photons

The generation of multiple pairs of entangled photons is a more general application of the multimode JPC 130 than the remote entanglement of multiple qubits by applying entangled photons to readout their state.

In FIG. 10, instead of the bus_a 810A being connected to the readout resonators 802 and qubits 820A, the bus_a 810A may be connected to a first quantum system (not shown) to receive entangled photons. Also, in FIG. 10, instead of the bus_b 810B being connected to the readout resonators 804 and qubits 820B, the bus_b 810B may be connected to a second quantum system (not shown) to receive entangled photons.

In another implementation, a first quantum system is connected directly to the circulator 1015A without bus_a 810A and a second quantum system is connected directly to the circulator 1015B without bus_b 810B.

Another beneficial property of the amplification process taking place in the multimode JPC 130 is that the multimode JPC 130 creates a two-mode squeezed state between the two nondegenerate modes of the JPC 130, according to an embodiment. In other words, the pump photons of the pump (P), which supply the energy for the amplification process, are down-converted via interaction with the dispersive nonlinear medium (i.e., JRM 105) in the multimode JPC 130; via the application of pump tones to the pump (P) port, the multimode JPC 130 generates multiple pairs of entangled photons whose frequencies lie within the dynamical bandwidths of the nondegenerate resonance modes of the multimode JPC 130, and whose frequency sum equals to the frequency of the applied pump tone.

Utilizing this property in a multimode nondegenerate device (i.e., the multimode JPC 130) allows for a wide range of applications in quantum information processing, such as generation of multiple entangled pairs of photons corresponding to different resonance frequencies of the multimode JPC 130 (particularly of the multimode resonators 115A and 115B) by applying simultaneously or consequentially multiple pump tones.

Figure 11:
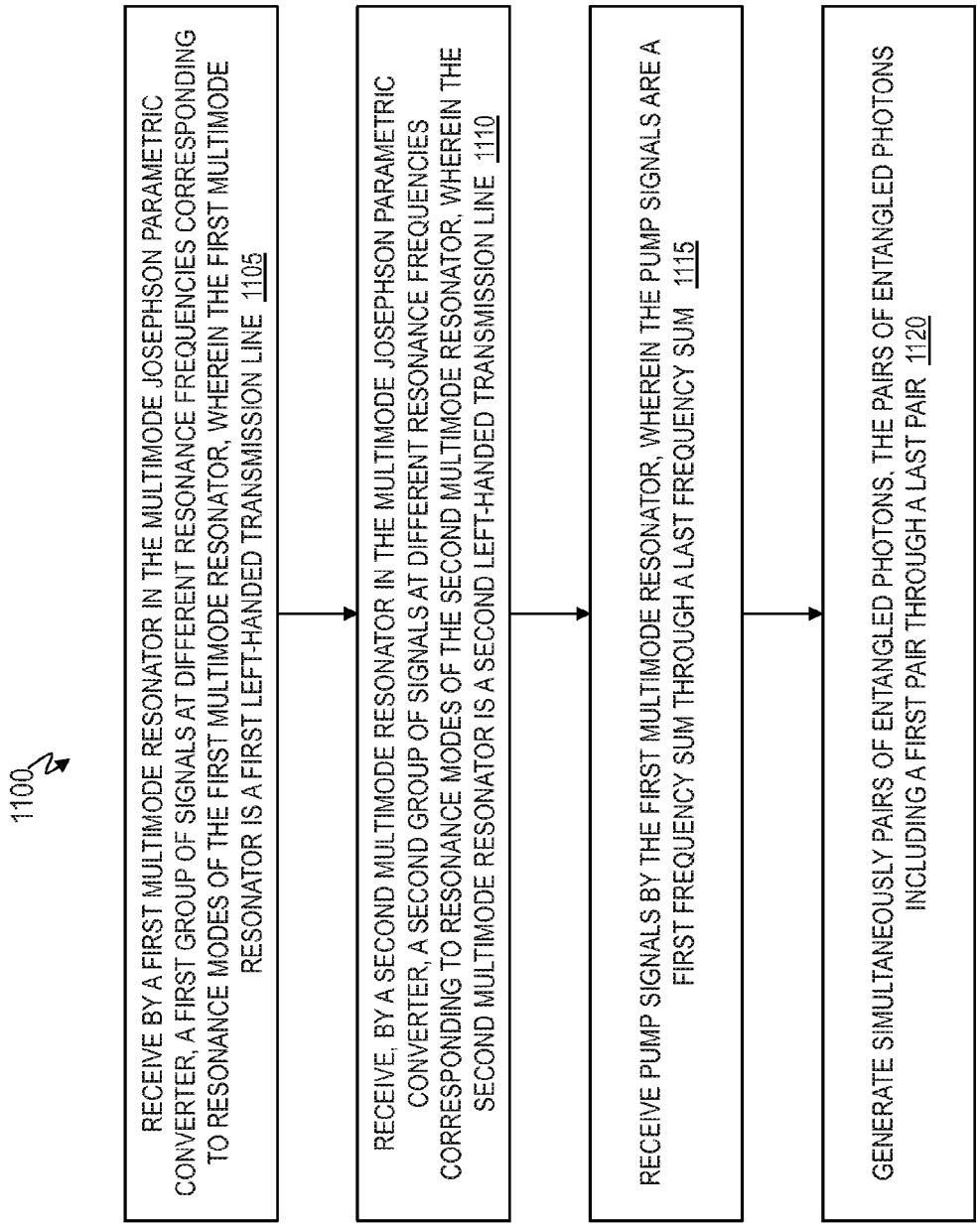
FIG. 11 is flow chart of a method of operating a multimode Josephson parametric converter to generate multiple pairs of entangled photons according to an embodiment.

FIG. 11 is flow chart 1100 of a method of operating a multimode Josephson parametric converter 130 to generate multiple pairs of entangled photons according to an embodiment.

At block 1105, the first multimode resonator_a 115A in the multimode Josephson parametric converter 130 is configured to receive a first group of signals at different resonance frequencies $f_1^a, f_2^a, f_3^a, \ldots, f_n^a$ in which the first group of signals corresponds to resonance modes of the first multimode resonator_a 115A, where the first multimode resonator is a first left-handed transmission line.

At block 1110, the second multimode resonator_b 115B in the multimode Josephson parametric converter 130 is configured to receive a second group of signals at different resonance frequencies $f_1^b, f_2^b, f_3^b, \ldots, f_n^b$ in which the second group of signals corresponds to resonance modes of the second multimode resonator_b 115B, where the second multimode resonator is a second left-handed transmission line.

At block 1115, pump signals are received by the second multimode resonator_b 115B, where the pump signals are a first (pump) frequency sum, a second (pump) frequency sum, through a last (pump) frequency sum. It is noted that although the pump is fed through the feedlines of resonator_b 115B and not through the feedlines of resonator_a 115A in FIG. 3, the pump may be injected through either sigma (Σ) port of the 180 hybrids. Accordingly, the 50Ω termination can be moved to the other side. Also, it is noted that the pumps do not need be applied in parallel, which allows for switching between different entangled pairs sequentially or in a certain order At block 1120, the multimode Josephson parametric converter 130 is configured to generate simultaneously or sequentially pairs of entangled photons, and the pairs of entangled photons include a first photon pair, a second photon pair, through a last photon pair.

For example, one photon in the first entangled photon pair may exit the JPC 130 via port_a 120A of the multimode resonator_a 115A at a readout frequency corresponding to a particular readout resonator 802 (e.g., readout resonator 802_1) and be transmitted to the circulator 1015A. The circulator 1015A may transmit the signal having the one photon to the bus_a 810A at a readout frequency that causes one of the qubits (e.g., qubit $q_1^a$) to be readout by the readout resonator 802_1. Concurrently, the other entangled photon in the first photon pair may exit the JPC 130 via port_b 120B of the multimode resonator_b 115B at a readout frequency corresponding to a particular readout resonator 804 (e.g., readout resonator 804_1) and be transmitted to the circulator 1015B. The circulator 1015B may transmit the signal having the other photon to the bus_b 810B at a readout frequency that causes one of the qubits (e.g., qubit $q_1^b$) to be read out by the readout resonator 804_1. The initial entanglement of the photons in the first photon pair are utilized to cause the entanglement of qubit pair ($q_1^a, q_1^b$). In another implementation, instead of outputting the entangled photons of the first photon pair from resonators 115A, 115B to readout resonators 802, 804, the photons of the first photon pair may be respectively output to a first and second quantum system, respectively. In this case, the entangled photons of the first photon pair still entangle aspects of the separate first and second quantum systems.

The first frequency sum is a summation of one resonance frequency of the first group plus one resonance frequency of the second group. The second frequency sum is a summation of another resonance frequency of the first group plus another resonance frequency of the second group. The third frequency sum is a summation of yet another resonance frequency of the first group plus yet another resonance frequency of the second group.

The first pair of the entangled photons corresponds to a first photon at the one resonance frequency of the first group (having been received by a quantum system connected to the multimode resonator_a 115A) and a first photon at the one resonance frequency of the second group (having been received by another quantum system connected to the multimode resonator_b 115B), in response to energy of the first frequency sum of the pump drive applied to the JPC 130 being down-converted via interaction with a dispersive nonlinear medium (e.g., JRM 105). Similarly, the second pair of the entangled photons corresponds to a second photon at the another resonance frequency of the first group and a second photon at the another resonance frequency of the second group, in response to energy of the second frequency sum of the pump drive being down-converted via interaction with the dispersive nonlinear medium. Likewise, the third pair of the entangled photons corresponds to a third photon at the yet another resonance frequency of the first group and a third photon at the yet another resonance frequency of the second group, in response to energy of the third frequency sum of the pump drive being down-converted via interaction with the dispersive nonlinear medium. As noted herein, certain combinations are pointed out for ease of understanding, but embodiments are not limited to the example combinations. It is understood that there are many more combinations.

The first group of signals and the second group of signals at the different resonance frequencies range from about 5-15 GHz.

Bell State Generator

Referring to FIGS. 1-6, this embodiment is useful in quantum computation schemes that use photons as quantum bits and utilizes the multimode JPC 130 that is comprised of two resonators (i.e., multimode resonator_a 115A and multimode resonator_b 115B) that are spatially nondegenerate (have different spatial ports) but temporally degenerate (have the same resonance frequencies). In particular, the multimode JPC 130 is configured such that two resonance modes in multimode resonator_a 115A have resonance frequencies that coincide with two resonance modes in multimode resonator_b 115B, i.e., $f_1^a = f_1^b = f_1$ and $f_2^a = f_2^b = f_2$. Also, it is noted that in this technique the JPC 130 does not function as an amplifier, but rather as a single-photon downconveter; hence, certain parameters of the device are modified and redesigned accordingly. In particular, the JRM and the coupling to the left-handed resonators are engineered such that a single pump photon gets downconverted to one pair of signal and idler photons. This can partially be achieved by using small Josephson junctions with small critical current in the JRM, and making the pump 'soft' (applied, e.g., at resonance).

By applying a pump tone at $f^p = f_1^a + f_2^b = f_2^a + f_1^b = f_1 + f_2$ to the multimode JPC 130, photons that get generated as a result of the down conversion process of pump photons via nonlinear interaction with the JRM 105 of the multimode JPC 130 are in an equal superposition of spatial states (in multimode resonator_a 115A and multimode resonator_b 115B).

The following example is provided. If experimenters assume without loss of generality that $f_2 > f_1$ and denote by the quantum states $|0^{f_1}_a\rangle$ and $|0^{f_1}_b\rangle$ the lack of a photon in multimode resonator_a 115A and multimode resonator_b 115B (depending on the subscript) at frequency $f_1$ and by the quantum states $|0^{f_2}_a\rangle$ and $|0^{f_2}_b\rangle$ the lack of a photon in multimode resonator_a 115A and multimode resonator_b 115B (depending on the subscript) at frequency $f_2$, and similarly denote by the quantum states $|1^{f_1}_a\rangle$ and $|1^{f_1}_b\rangle$ the presence of a photon in multimode resonator_a 115A and multimode resonator_b 115B (depending on the subscript) at frequency $f_1$ and by the quantum states $|1^{f_2}_a\rangle$ and $|1^{f_2}_b\rangle$ the presence of a photon in multimode resonator_a 115A and multimode resonator_b 115B (depending on the subscript) at frequency $f_2$, then the quantum state of the system of the multimode JPC 130 can be written as:

$$|b_2 b_1 a_2 a_1\rangle = \frac{1}{\sqrt{2}}(|1_b 0_b 0_a 1_a\rangle + |0_b 1_b 1_a 0_a\rangle).$$

In the above equation, the subscript "a" denotes multimode resonator_a 115A, and the subscript "b" denotes multimode resonator_b 115B. The parameter (or place holder) "$a_1$" which can have a value "0" or "1" represents the lack or presence of a photon at frequency $f_1$ in multimode resonator_a 115A respectively. The parameter (or place holder) "$a_2$" which can have a value "0" or "1" represents the lack or presence of a photon at frequency $f_2$ in multimode resonator_a 115A respectively. The parameter (or place holder) "$b_1$" which can have a value "0" or "1" represents the lack or presence of a photon at frequency $f_1$ in multimode resonator_b 115B respectively. The parameter (or place holder) "$b_2$" which can have a value "0" or "1" represents the lack or presence of a photon at frequency $f_2$ in multimode resonator_b 115B.

Furthermore, by associating logical qubit states with photons being either in mode 1 or 2 of resonators 115A and 115B, i.e., $|0_a\rangle_L = |0^{f_2}_a 1^{f_1}_a\rangle$, $|0_b\rangle_L = |0^{f_2}_b 1^{f_1}_b\rangle$, $|1_a\rangle_L = |1^{f_2}_a 0^{f_1}_a\rangle$, and $|1_b\rangle_L = |1^{f_2}_b 0^{f_1}_b\rangle$, then the quantum state of the system for the JPC 130 can be rewritten as $$|b_L a_L\rangle = \frac{1}{\sqrt{2}}(|1_b 0_a\rangle_L + |0_b 1_a\rangle_L),$$

which represents a Bell state for logical qubits 'a' and 'b' whose computation state '$0_{a,b}$' corresponds to the case where a photon is present in mode 1 and lacking in mode 2 of multimode resonator_a and multimode resonator_b respectively, and whose computation state '$1_{a,b}$' corresponds to the case where a photon is lacking in mode 1 and present in mode 2 of multimode resonator_a and multimode resonator_b respectively.

Figure 12:
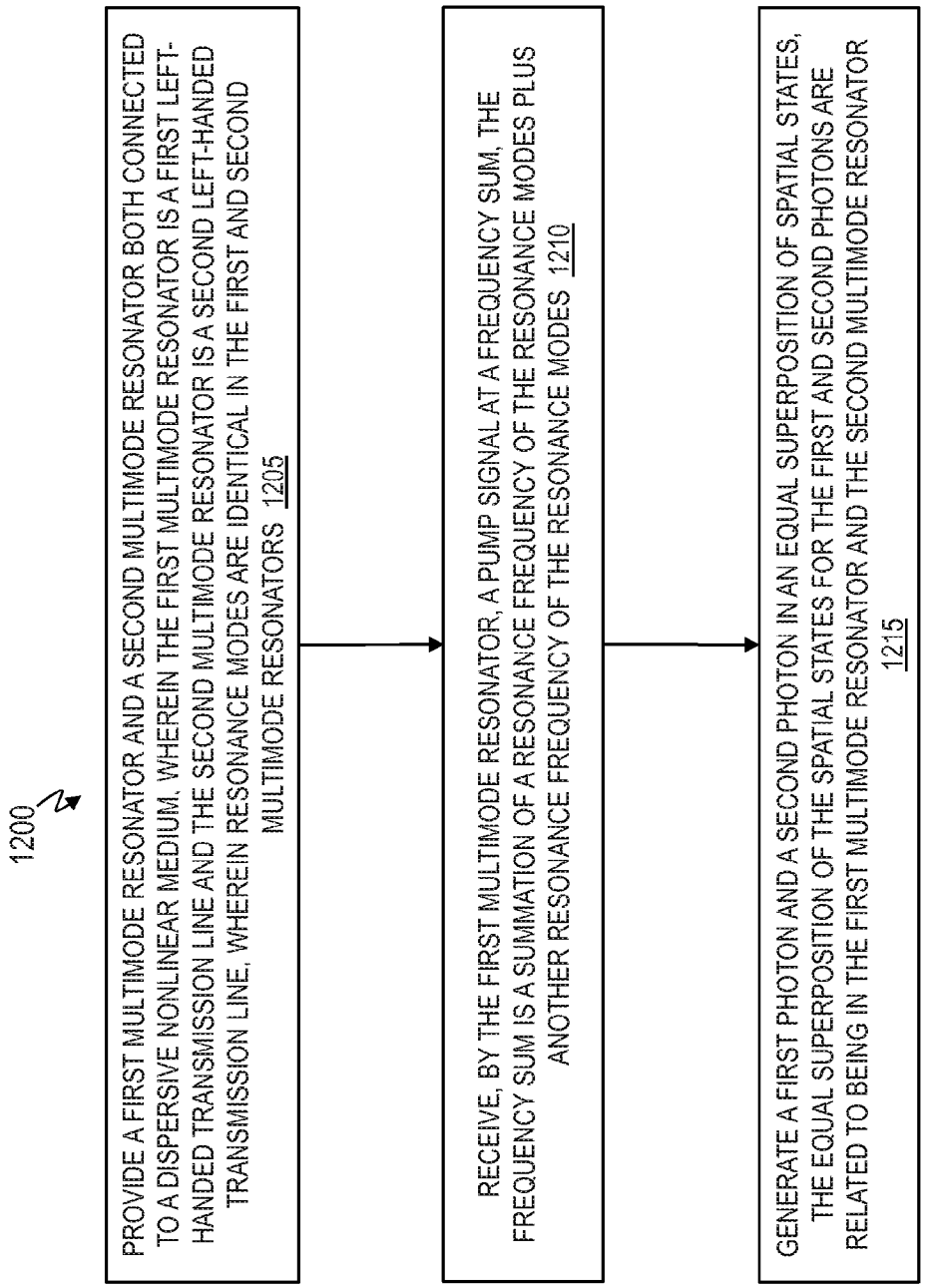
FIG. 12 is a flow chart of a method of generating a bell state using photons as quantum bits according to an embodiment.

FIG. 12 is a flow chart 1200 of a method of generating a bell state using photons as quantum bits according to an embodiment.

At block 1205, a first multimode resonator_a 115A and a second multimode resonator_b 115B (in JPC 130) are both connected to a dispersive nonlinear medium (e.g., JRM 105), where the first multimode resonator is a first left-handed transmission line and the second multimode resonator is a second left-handed transmission line, and where resonance modes are identical in the first and second multimode resonators (i.e., $f_1^a$, $f_2^a$, $f_3^a$, ..., $f_n^a$ respectively equal $f_1^b$, $f_2^b$, $f_3^b$, ..., $f_n^b$).

At block 1210, the second multimode resonator_b 115B receives a pump signal at a frequency sum, the frequency sum is a summation of a (certain) resonance frequency of the resonance modes plus another resonance frequency of the resonance modes.

At block 1215, a first photon and a second photon in an equal superposition of spatial states are generated in the JPC 130, where the equal superposition of the spatial states for the first and second photons are related to being in the first multimode resonator_a 115A and the second multimode resonator_b 115B.

The equal superposition of the spatial states for the first photon is configured such that the first photon has an equal probability of being in (or not being in) the first multimode resonator_a 115A or the second multimode resonator_b 115B. The equal superposition of the spatial states for the second photon is configured such that the second photon has an equal probability of being in (or not being in) the first multimode resonator_a 115A or the second multimode resonator_b 115B.

The first photon and the second photon are not both in the same one of the first and second multimode resonators 115A, 115B. That is, if the first photon is in the first multimode resonator_a 115A, then the second photon is in the second multimode resonator_b 115B. Conversely, if the second photon is in the first multimode resonator_a 115A, then the first photon is in the second multimode resonator_b 115B.

Unitary Frequency Conversion Between Two Propagating Microwave Signals that are Close in Frequency The feature that the density of modes (frequency resonance modes) of JPC resonators (multimode resonator_a 115A and multimode resonator_b 115B) which are comprised of left-handed transmission lines is large close to their low-frequency bound $f_{IR}=\omega_{IR}/2\pi$ allows the multimode JPC 130 to perform unitary frequency conversion between pairs of propagating microwave modes that are close in frequency (e.g., tens of megahertz) by pumping (via pumps P) the multimode JPC 130 with parallel pump tones whose frequencies correspond to the frequency difference between the resonance frequencies (of the propagating microwave signals (e.g., S signal and I signal to respective resonators 115A and 115B).

For example, if a quantum signal (e.g., S) at frequency $f_1^a$ is sent to the multimode resonator_a 115A and a quantum signal (e.g., I) at frequency $f_2^b$ is sent to the multimode resonator_b 115B, in order to perform a unitary frequency conversion between this pair of propagating microwave modes pump tone at the frequency difference $f_1^P=|f_1^a-f_2^b|$ is injected to the JPC 130. The term unitary frequency conversion means that the signal is converted from one frequency to another without loss of information, or in other words the signal is converted in a lossless (no photons are lost) and coherent (the phase is preserved) manner. Analogously, this conversion process can be generalized to other pairs of propagating microwave signals input on port_a and port_b and whose frequencies lie within the bandwidths of resonance modes of resonator_a and resonator_b that couple to the JRM by applying appropriate pump drives.

According to one implementation, if the pump frequencies required to perform the frequency conversion between the modes lie below the cutoff frequency of the metamaterial resonators 115A and 115B, a particular method of pumping the JRM 105 may be applied that is different from injecting the pump tones directly to the multimode resonators 115A and 115B. One such method is pumping the JRM 105 using a three-port power divider capacitively coupled to the JRM 105 directly.

It will be noted that various microelectronic device fabrication methods may be utilized to fabricate the components/elements discussed herein as understood by one skilled in the art. In semiconductor or superconducting device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of operating a multimode Josephson parametric converter as a multimode quantum limited amplifier, the method comprising:
    receiving, by the multimode Josephson parametric converter, multiple quantum signals simultaneously at different resonance frequencies such that a first group of the multiple quantum signals is received at a first multimode resonator and a second group of the multiple quantum signals is received at a second multimode resonator;
    receiving, by the multimode Josephson parametric converter, pump signals;
    amplifying simultaneously, by the multimode Josephson parametric converter, the multiple quantum signals, wherein the multimode Josephson parametric converter operates in reflection; and
    reflecting the multiple quantum signals having been amplified at the different resonance frequencies.

2. The method of claim 1, wherein the first group of the different resonance frequencies are of resonance modes of the first multimode resonator;
    wherein the first multimode resonator is a first left-handed transmission line;
    wherein the second group of the different resonance frequencies are of resonance modes of the second multimode resonator; and
    wherein the second multimode resonator is a second left-handed transmission line.

3. The method of claim 2, wherein each of the pump signals is a frequency sum of one of the different resonance frequencies in the first group and one of the different resonance frequencies in the second group, such that the multiple quantum signals at the one of the first group and the one of the second group are amplified.

4. The method of claim 2, wherein a first pump signal is a first frequency sum of a first resonance frequency in the first group plus a first resonance frequency in the second group, a second pump signal is a second frequency sum of a second resonance frequency in the first group plus a second resonance frequency in the second group, through a last pump signal that is a last frequency sum of a last resonance frequency in the first group plus a last resonance frequency in the second group.

5. The method of claim 4, wherein at least one of the first through last resonance frequencies in the first group and the first through last resonance frequencies in the second group is a same.

6. The method of claim 4, wherein at least one of the first through last resonance frequencies in the first group and the first through last resonance frequencies in the second group is different.

7. The method of claim 1, wherein the multiple quantum signals at the different frequencies range from about 5-15 GHz.

8. The method of claim 1, wherein the multimode Josephson parametric converter is configured to amplify simultaneously the multiple quantum signals at the different resonance frequencies via a first multimode resonator and a second multimode resonator, the first and second multimode resonators being connected to a dispersive nonlinear medium.

9. A method of operating a multimode Josephson parametric converter to generate multiple pairs of entangled photons, the method comprising:
   receiving, by a first multimode resonator in the multimode Josephson parametric converter, a first group of signals at different resonance frequencies of the resonance modes of the first multimode resonator, wherein the first multimode resonator is a first left-handed transmission line;
   receiving, by a second multimode resonator in the multimode Josephson parametric converter, a second group of signals at different resonance frequencies of the resonance modes of the second multimode resonator, wherein the second multimode resonator is a second left-handed transmission line;
   receiving pump signals, by the second multimode resonator; and
   generating simultaneously, by the multimode Josephson parametric converter, pairs of entangled photons.

10. The method of claim 9, wherein the pump signals are a first frequency sum through a last frequency sum;
    wherein the pairs of entangled photons include a first pair through a last pair;
    wherein the first frequency sum is a summation of one resonance frequency of the first group plus one resonance frequency of the second group, wherein a second frequency sum is a summation of another resonance frequency of the first group plus another resonance frequency of the second group, and wherein the last frequency sum is a summation of yet another resonance frequency of the first group plus yet another resonance frequency of the second group.

11. The method of claim 10, wherein the first pair of the entangled photons corresponds to a first photon at the one resonance frequency of the first group and a first photon at the one resonance frequency of the second group, in response to energy of the first frequency sum of the pump signals being down-converted via interaction with a dispersive nonlinear medium;
    wherein a second pair of the entangled photons corresponds to a second photon at the another resonance frequency of the first group and a second photon at the another resonance frequency of the second group, in response energy to the second frequency sum of the pump signals being down-converted via interaction with the dispersive nonlinear medium; and
    wherein the last pair of the entangled photons corresponds to a last photon at the yet another resonance frequency of the first group and a last photon at the yet another resonance frequency of the second group, in response to energy of the third frequency sum of the pump signals being down-converted via interaction with the dispersive nonlinear medium.

12. The method of claim 9, wherein the first group of signals and the second group of signals at the different resonance frequencies range from about 5-15 GHz.

\* \* \* \* \*